United States Patent
Jang et al.

(10) Patent No.: US 11,923,286 B2
(45) Date of Patent: Mar. 5, 2024

(54) PACKAGE SUBSTRATE AND SEMICONDUCTOR PACKAGE INCLUDING THE SAME

(71) Applicant: SAMSUNG ELECTRONICS CO., LTD., Suwon-si (KR)

(72) Inventors: Wonjung Jang, Cheonan-si (KR); Chulyong Jang, Anyang-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 197 days.

(21) Appl. No.: 17/460,745

(22) Filed: Aug. 30, 2021

(65) Prior Publication Data
US 2022/0199511 A1 Jun. 23, 2022

(30) Foreign Application Priority Data
Dec. 21, 2020 (KR) ........................ 10-2020-0179917

(51) Int. Cl.
*H01L 23/48* (2006.01)
*H01L 23/00* (2006.01)
*H01L 23/498* (2006.01)

(52) U.S. Cl.
CPC .. *H01L 23/49838* (2013.01); *H01L 23/49822* (2013.01); *H01L 23/49866* (2013.01); *H01L 24/16* (2013.01); *H01L 2224/16227* (2013.01)

(58) Field of Classification Search
CPC ......... H01L 23/49838; H01L 23/49822; H01L 23/49866; H01L 24/16
See application file for complete search history.

(56) References Cited

U.S. PATENT DOCUMENTS

| | | | |
|---|---|---|---|
| 5,340,639 A | 8/1994 | Nakamura | |
| 5,611,481 A | 3/1997 | Akamatsu et al. | |
| 5,633,535 A * | 5/1997 | Chao ................... | H05K 3/303 257/E21.511 |
| 6,229,209 B1 * | 5/2001 | Nakamura ........ | H01L 23/49827 257/E21.511 |
| 6,335,571 B1 * | 1/2002 | Capote .................. | H01L 24/81 257/E21.511 |
| 6,413,620 B1 * | 7/2002 | Kimura .................. | H05K 3/20 428/209 |
| 6,849,944 B2 * | 2/2005 | Murtuza ................ | H05K 3/303 257/737 |
| 8,318,537 B2 * | 11/2012 | Pendse .............. | H01L 23/49811 438/109 |
| 8,841,779 B2 * | 9/2014 | Pendse .............. | H01L 23/49838 257/778 |

(Continued)

OTHER PUBLICATIONS

US 9,721,918 B2, 08/2017, Tsai et al. (withdrawn)

*Primary Examiner* — Nicholas J Tobergte
(74) *Attorney, Agent, or Firm* — Sughrue Mion, PLLC

(57) ABSTRACT

A package substrate includes an insulating layer having a mounting surface; a wiring pattern extending in the insulating layer; and a chip bonding pad provided on the mounting surface of the insulating layer and connected to the wiring pattern, the chip bonding pad having a tapered shape in which a horizontal cross-sectional area thereof gradually decreases away from the mounting surface of the insulating layer in a vertical direction. A portion of the chip bonding pad closest to the mounting surface of the insulating layer has a horizontal length of about 20 micrometers (μm) to about 30 μm.

20 Claims, 21 Drawing Sheets

(56) References Cited

U.S. PATENT DOCUMENTS

| | | | |
|---|---|---|---|
| 9,536,850 B2 | 1/2017 | Yu et al. | |
| 2003/0006062 A1* | 1/2003 | Stone | H01L 24/16 257/E23.021 |
| 2003/0098513 A1 | 5/2003 | Huang | |
| 2004/0121606 A1* | 6/2004 | Raskin | H01L 24/05 438/694 |
| 2006/0267157 A1* | 11/2006 | Edwards | H05K 3/3436 257/E23.072 |
| 2008/0185704 A1* | 8/2008 | Hsu | H01L 24/19 257/690 |
| 2008/0211092 A1* | 9/2008 | Lu | H01L 24/11 257/737 |
| 2009/0039490 A1* | 2/2009 | Fan | H01L 25/105 257/686 |
| 2012/0161330 A1* | 6/2012 | Hlad | H01L 21/4857 257/774 |
| 2013/0241052 A1* | 9/2013 | Chang | H01L 24/19 257/737 |
| 2014/0110839 A1* | 4/2014 | Lin | H01L 25/0657 257/E21.589 |
| 2015/0156860 A1 | 6/2015 | Lee et al. | |
| 2017/0345785 A1 | 11/2017 | Tsai et al. | |

\* cited by examiner

PACKAGE SUBSTRATE AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2020-0179917, filed on Dec. 21, 2020, in the Korean Intellectual Property Office, the disclosure of which is incorporated by reference herein in its entirety.

BACKGROUND

The disclosure relates to a package substrate, on which a semiconductor chip is mounted, and a semiconductor package including the package substrate.

Along with the increasing storage capacity of semiconductor packages, the semiconductor packages including semiconductor chips are required to have lower thicknesses and lighter weights. In addition, studies for improving the structural reliability of semiconductor packages have been actively made. For example, studies for improving the bonding reliability between semiconductor chips and package substrates, when the semiconductor chips are flip-chip-bonded onto the package substrates, are being made.

SUMMARY

One or more example embodiments provide a package substrate capable of improving the bonding reliability between a chip connection terminal of a semiconductor chip and a chip connection pad of a package substrate in mounting the semiconductor chip on the package substrate.

In accordance with an aspect of an example embodiment, a package substrate includes an insulating layer having a mounting surface; a wiring pattern extending in the insulating layer; and a chip bonding pad provided on the mounting surface of the insulating layer and connected to the wiring pattern, the chip bonding pad having a tapered shape in which a horizontal cross-sectional area of the chip bonding pad gradually decreases away from the mounting surface of the insulating layer in a vertical direction, wherein a portion of the chip bonding pad closest to the mounting surface of the insulating layer has a horizontal length of about 20 μm to about 30 μm.

In accordance with an aspect of an example embodiment, a package substrate includes: an insulating layer having a mounting surface; a wiring pattern extending in the insulating layer; and a chip bonding pad provided on the mounting surface of the insulating layer and connected to the wiring pattern, wherein the chip bonding pad includes a connection portion having a uniform horizontal cross-sectional area in a vertical direction with respect to the mounting surface of the insulating layer, and a bonding portion having a tapered shape in which a horizontal cross-sectional area of the bonding portion decreases away from the mounting surface of the insulating layer in the vertical direction, wherein a vertical cross-section of the bonding portion of the chip bonding pad has a trapezoidal shape in which a length of a top side of the bonding portion is less than a length of a bottom side of the bonding portion, wherein the top side of the bonding portion has a length of about 5 μm to about 25 μm, and wherein the bottom side of the bonding portion has a length which is greater than the length of the top side of the bonding portion and is in a range of about 20 μm to about 30 μm.

In accordance with an aspect of an example embodiment, a semiconductor package includes a package substrate including an insulating layer having a mounting surface, a wiring pattern extending in the insulating layer, and a chip bonding pad provided on the mounting surface of the insulating layer and connected to the wiring pattern, the chip bonding pad having a tapered shape in which a horizontal cross-sectional area of the chip bonding pad decreases away from the mounting surface of the insulating layer in a vertical direction; and a semiconductor chip mounted on the package substrate, the semiconductor chip including a semiconductor substrate having a top surface and a bottom surface, and including an active layer adjacent to the bottom surface, a chip pad provided on the bottom surface of the semiconductor substrate and connected to the active layer, and a chip connection terminal connecting the chip pad to the chip bonding pad of the package substrate, wherein a vertical cross-section of the chip bonding pad has a trapezoidal shape, wherein a top side of the vertical cross-section of the chip bonding pad has a horizontal length of about 5 μm to about 25 μm, wherein a bottom side of the vertical cross-section of the chip bonding pad has a horizontal length that is about 1.1 times to about 6 times the horizontal length of the top side, wherein lateral sides of the vertical cross-section of the chip bonding pad connect the top side to the bottom side, and wherein the chip connection terminal surrounds the top side and the lateral sides of the chip bonding pad.

BRIEF DESCRIPTION OF THE DRAWINGS

The above and other aspects, features, and advantages of certain embodiments of the disclosure will be more apparent from the following description taken in conjunction with the accompanying drawings in which.

DETAILED DESCRIPTION

Figure 1:
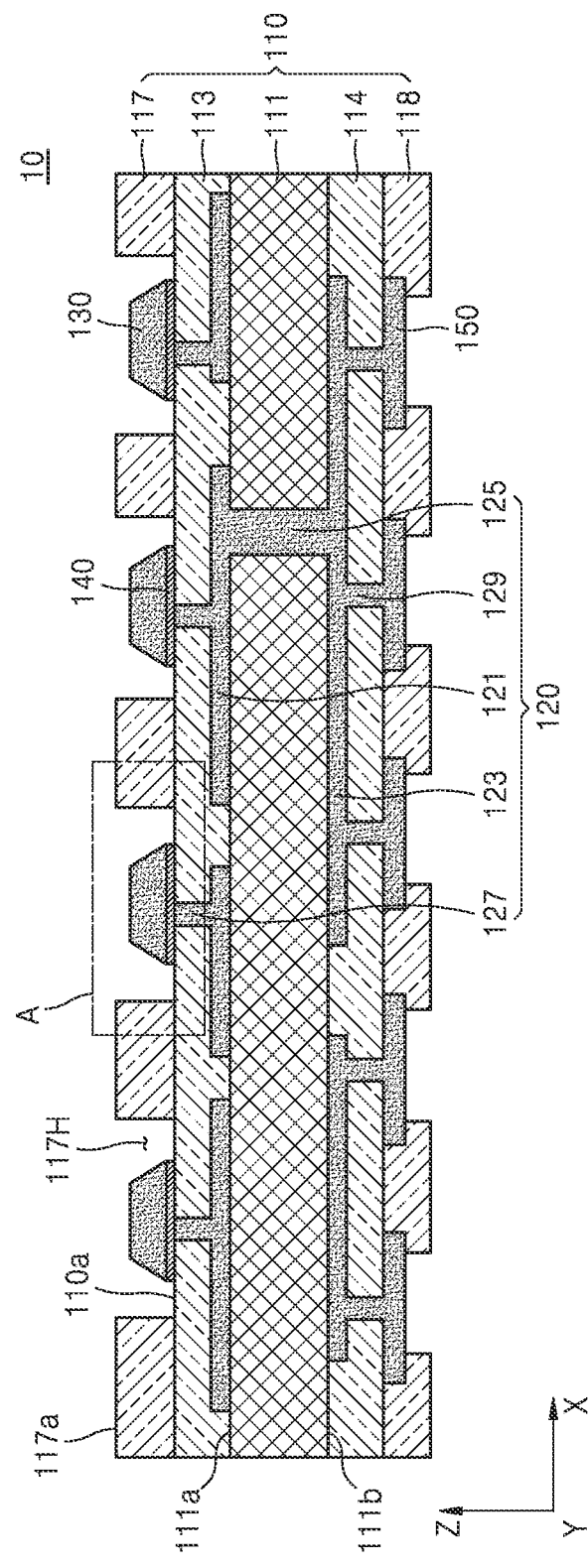
FIG. 1 is a cross-sectional view of a package substrate according to an example embodiment.

Hereinafter, example embodiments of the disclosure will be described in detail with reference to the accompanying drawings. Like components are denoted by like reference numerals throughout the specification, and repeated descriptions thereof are omitted.

FIG. 1 is a cross-sectional view of a package substrate 10 according to an example embodiment. In addition, FIG. 2 is an enlarged view of a region indicated by "A" in FIG. 1

The package substrate 10 according to an example embodiment may be a substrate configured to mount a semiconductor chip 50 (see FIG. 6) thereon. In an example embodiment, the package substrate 10 may include a printed circuit board (PCB). However, the package substrate 10 is not limited to a PCB and may include various substrates configured to mount a semiconductor chip thereon.

Figure 2:
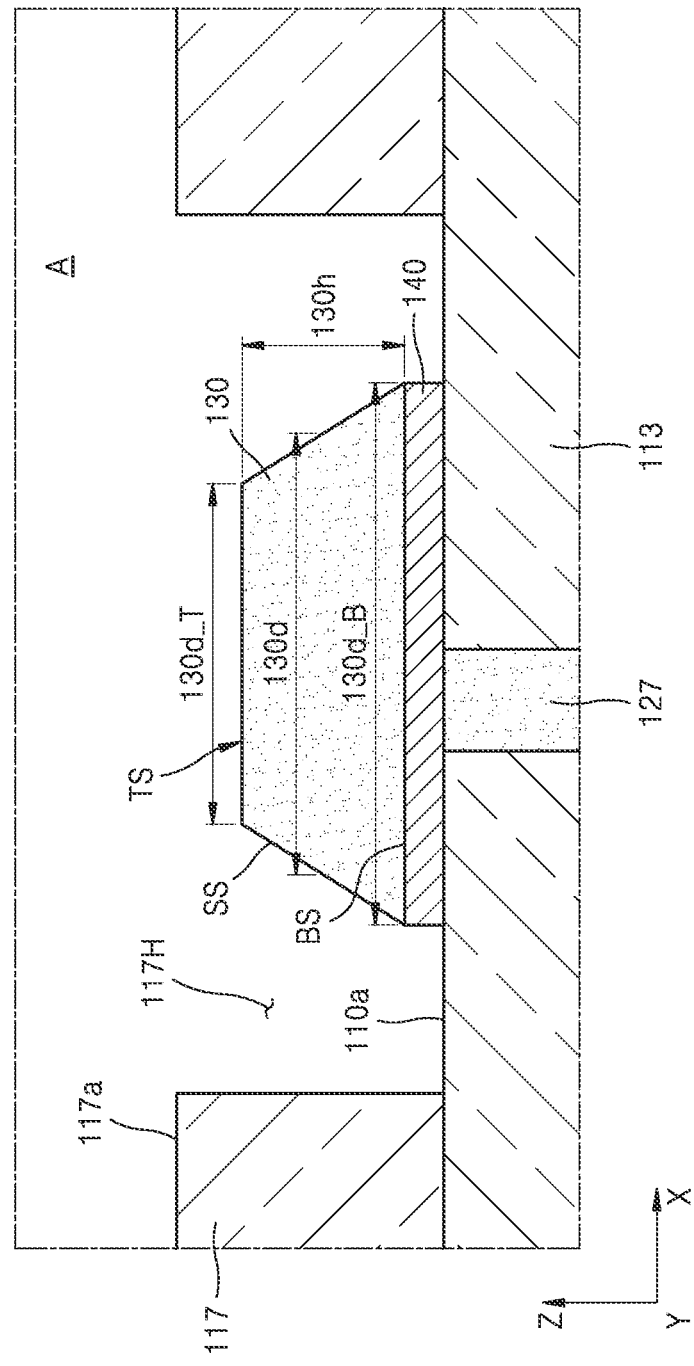
FIG. 2 is an enlarged view of a region indicated by "A" in FIG. 1.

Referring together to FIGS. 1 and 2, the package substrate 10 according to an example embodiment may include an insulating layer 110, a wiring pattern 120, a chip bonding pad 130, a pad seed layer 140, an external connection pad 150, and the like.

The insulating layer 110 of the package substrate 10 may be a layer of an insulating material, which surrounds the wiring pattern 120. In addition, the insulating layer 110 may have a multilayer structure in which a plurality of insulating material layers are stacked.

In an example embodiment, the insulating layer 110 may include a base insulating layer 111, a first upper insulating layer 113, a first lower insulating layer 114, a second upper insulating layer 117, and a second lower insulating layer 118. For example, the insulating layer 110 may have a multilayer structure in which the second lower insulating layer 118, the first lower insulating layer 114, the base insulating layer 111, the first upper insulating layer 113, and the second upper insulating layer 117 are sequentially stacked in the stated order.

In an example embodiment, the insulating layer 110 may have a mounting surface 110a on which the chip bonding pad 130 is mounted. For example, the mounting surface 110a of the insulating layer 110 may be a portion of an upper surface of the first upper insulating layer 113, the portion being exposed by a hole 117h of the second upper insulating layer.

Herein, a horizontal direction may be defined as a direction parallel to an extension direction of the mounting surface 110a of the insulating layer 110, and a vertical direction may be defined as a direction passing perpendicular to the mounting surface 110a of the insulating layer 110 (for example, the Z direction of FIG. 1).

In an example embodiment, the base insulating layer 111 may be a layer that is a base of the package substrate 10. In addition, the base insulating layer 111 may have a top surface 111a and a bottom surface 111b that is opposite to the top surface 111a.

In an example embodiment, the base insulating layer 111 may include at least one of a phenol resin, an epoxy resin, or polyimide. For example, the base insulating layer 111 may include at least one of Flame Retardant 4 (FR4), tetrafunctional epoxy, polyphenylene ether, epoxy/polyphenylene oxide, bismaleimide triazine (BT), Thermount, cyanate ester, polyimide, or a liquid crystal polymer.

In an example embodiment, the first upper insulating layer 113 and the second upper insulating layer 117 may be arranged on the top surface 111a of the base insulating layer 111, and the first lower insulating layer 114 and the second lower insulating layer 118 may be arranged on the bottom surface 111b of the base insulating layer 111.

In an example embodiment, each of the first upper insulating layer 113, the second upper insulating layer 117, the first lower insulating layer 114, and the second lower insulating layer 118 may include an oxide or a nitride. For example, each of the first upper insulating layer 113, the second upper insulating layer 117, the first lower insulating layer 114, and the second lower insulating layer 118 may include silicon oxide or silicon nitride.

However, embodiments of the disclosure are not limited to the above description, and each of the first upper insulating layer 113, the second upper insulating layer 117, the first lower insulating layer 114, and the second lower insulating layer 118 may include a photo-imageable dielectric (PID) material allowing a photolithography process to be performed thereon.

For example, each of the first upper insulating layer 113, the second upper insulating layer 117, the first lower insulating layer 114, and the second lower insulating layer 118 may include at least one of photosensitive polyimide (PSPI) or polybenzobisoxazole (PBO).

In an example embodiment, the first upper insulating layer 113, the second upper insulating layer 117, the first lower insulating layer 114, and the second lower insulating layer 118 may be formed by applying a photo-imageable solder resist onto a surface of the base insulating layer 111 by a screen printing method or a spray coating method.

However, embodiments of the disclosure are not limited to the above description, and the first upper insulating layer 113, the second upper insulating layer 117, the first lower insulating layer 114, and the second lower insulating layer 118 may be formed by bonding a film-type solder resist material to the surface of the base insulating layer 111 by a laminating method, followed by removing unnecessary portions thereof by an exposure process and a development process.

The wiring pattern 120 of the package substrate 10 may be arranged inside the insulating layer 110 and may be a pattern of a conductive material, which connects the chip bonding pad 130 to the external connection pad 150. For example, the wiring pattern 120 may connect two or more chip bonding pads 130 to one external connection pad 150. However, embodiments of the disclosure are not limited to the above description, and the wiring pattern 120 may connect one chip bonding pad 130 to one external connection pad 150.

In an example embodiment, the wiring pattern 120 may include an upper wiring line pattern 121 (i.e., a first wiring line pattern), a lower wiring line pattern 123 (i.e., a second wiring line pattern), a wiring via pattern 125, an upper pad via pattern 127, and a lower pad via pattern 129.

In an example embodiment, a material of the wiring pattern 120 may include, but is not limited to, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

In an example embodiment, the upper wiring line pattern 121 may be arranged on the top surface 111a of the base insulating layer 111 to extend in the horizontal direction (for example, a direction parallel to an X-Y plane as shown in FIG. 1). In other words, the upper wiring line pattern 121 may be arranged to extend in a direction that is parallel to an extension direction of the top surface 111a of the base insulating layer 111. In addition, the upper wiring line pattern 121 may be covered by the first upper insulating layer 113.

In an example embodiment, the lower wiring line pattern 123 may be arranged on the bottom surface 111b of the base insulating layer 111 to extend in the horizontal direction. In addition, the lower wiring line pattern 123 may be covered by the first lower insulating layer 114.

In an example embodiment, the wiring via pattern 125 may pass through the base insulating layer 111 in the vertical direction (for example, a Z direction as shown in FIG. 1) and connect the upper wiring line pattern 121 to the lower wiring line pattern 123. In other words, the wiring via pattern 125 may pass through the top surface 111a and the bottom surface 111b of the base insulating layer 111 in the vertical direction and connect the upper wiring line pattern 121 to the lower wiring line pattern 123.

In an example embodiment, the upper pad via pattern 127 may pass through a portion of the first upper insulating layer 113 in the vertical direction and connect the upper wiring line pattern 121 to the chip bonding pad 130. For example, the upper pad via pattern 127 may pass through a portion of the first upper insulating layer 113 in the vertical direction and be arranged between the pad seed layer 140 and the upper wiring line pattern 121.

In an example embodiment, the lower pad via pattern 129 may pass through a portion of the first lower insulating layer 114 in the vertical direction and connect the lower wiring line pattern 123 to the external connection pad 150.

The chip bonding pad 130 of the package substrate 10 may be arranged on the mounting surface 110a of the insulating layer 110 (for example, on an upper surface of the first upper insulating layer 113) and may be a pad configured to electrically connect the semiconductor chip 50 (see FIG. 6) to the wiring pattern 120. In an example embodiment, the chip bonding pad 130 may be a pad contacting a chip connection terminal 530 of the semiconductor chip 50.

In an example embodiment, a material of the chip bonding pad 130 may include, but is not limited to, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

In an example embodiment, the chip bonding pad 130 may have a tapered shape having a horizontal cross-sectional area that gradually decreases away vertically from the mounting surface 110a of the insulating layer 110, on which the chip bonding pad 130 is mounted.

As shown in FIGS. 1 and 2, when a vertical cross-section (for example, a cross-section on an X-Z plane) of the chip bonding pad 130 is considered, a horizontal length 130d of the chip bonding pad 130 may gradually decrease away from the mounting surface 110a of the insulating layer 110 in the vertical direction.

In an example embodiment, because the chip bonding pad 130 may have a tapered shape, a maximum value of the horizontal length of the chip bonding pad 130 may be a horizontal length of a lowermost portion of the chip bonding pad 130.

In an example embodiment, the maximum value of the horizontal length of the chip bonding pad 130 (for example, 130d_B of FIG. 2) may range from about 20 micrometers (µm) to about 30 µm. In other words, when the vertical cross-section of the chip bonding pad 130 is considered, a portion of the chip bonding pad 130, which is closest to the mounting surface 110a of the insulating layer 110, may have a horizontal length of about 20 µm to about 30 µm.

For example, when the vertical cross-section of the chip bonding pad 130 has a trapezoidal shape, a triangular shape, or a semicircular shape, a bottom side of the vertical cross-section of the chip bonding pad 130 may have a length of about 20 µm to about 30 µm.

In an example embodiment, the chip bonding pad 130 may have a circular truncated cone shape. For example, the shape of the chip bonding pad 130 may be a shape of a three-dimensional figure not including the vertex of a circular cone, out of two three-dimensional figures obtained by cutting the circular cone in a direction parallel to the base of the circular cone.

For example, the vertical cross-section of the chip bonding pad 130 may have a trapezoidal shape having a top side TS, a bottom side BS that is greater in length than the top side TS, and lateral sides SS connecting the top side TS to the bottom side BS.

In addition, a horizontal cross-section (for example, a cross-section on the X-Y plane) of the chip bonding pad 130 may have a circular shape. Further, when the horizontal cross-section of the chip bonding pad 130 has a shape of a circle, the horizontal length 130d of the chip bonding pad 130 may be defined as a diameter of the circle. The horizontal length 130d of the chip bonding pad 130 may gradually decrease away from the mounting surface 110a of the insulating layer 110 in the vertical direction.

In an example embodiment, when the chip bonding pad 130 has a circular truncated cone shape (that is, when the vertical cross-section of the chip bonding pad 130 has a trapezoidal shape), the top side TS of the chip bonding pad 130 may be a side having a smallest value of the horizontal length 130d of the chip bonding pad 130 (for example, 130d_T of FIG. 2), and the bottom side BS of the chip bonding pad 130 may be a side having a greatest value of the horizontal length 130d of the chip bonding pad 130.

In an example embodiment, when the chip bonding pad 130 has a circular truncated cone shape, the top side TS of the chip bonding pad 130 may have length 130d_T of about 5 µm to about 25 µm.

In addition, the bottom side BS of the chip bonding pad 130 may have a length 130d_B, which is greater than the length 130d_T of the top side TS, in a range of about 20 µm to about 30 µm. In other words, the portion of the chip bonding pad 130, which is closest to the mounting surface 110a of the insulating layer 110, may have a horizontal length, which is greater than the length 130d_T of the top side TS, in a range of about 20 µm to about 30 µm.

In addition, a height 130h defined as a vertical length between the top side TS and the bottom side BS in the chip bonding pad 130 may range from about 12 µm to about 18 µm.

When the length 130d_T of the top side TS of the chip bonding pad 130 is less than 5 µm, the alignment between the chip connection terminal 530 (see FIG. 6) of the semiconductor chip 50 (see FIG. 6) and the chip bonding pad 130 may be difficult. In addition, the reliability of the electrical connection between the chip connection terminal 530 and the chip bonding pad 130 may be poor.

Further, when the length 130d_T of the top side TS of the chip bonding pad 130 is greater than 25 µm, in attaching the chip connection terminal 530 to the chip bonding pad 130, as the chip connection terminal 530 diffuses on a surface of the chip bonding pad 130, the chip connection terminal 530 may have a relatively small height. Accordingly, the structural reliability between the chip connection terminal 530 and the chip bonding pad 130 may be poor.

When the length 130d_B of the bottom side BS of the chip bonding pad 130 is less than 20 µm, the alignment between the chip connection terminal 530 (see FIG. 6) of the semiconductor chip 50 (see FIG. 6) and the chip bonding pad 130 may be difficult. In addition, the reliability of the electrical connection between the chip connection terminal 530 and the chip bonding pad 130 may be poor.

Further, when the length 130d_B of the bottom side BS of the chip bonding pad 130 is greater than 30 µm, in attaching the chip connection terminal 530 to the chip bonding pad 130, the bonding strength between a bottom surface of the chip bonding pad 130 and the mounting surface 110a of the insulating layer 110 may be deteriorated. Accordingly, the structural reliability between the chip bonding pad 130 and the insulating layer 110 may be poor.

When the height 130h of the chip bonding pad 130 is less than 12 µm, in attaching the chip connection terminal 530 to the chip bonding pad 130, some chip connection terminals 530 may not be attached to the surface of the chip bonding pad 130.

In addition, when the height 130h of the chip bonding pad 130 is greater than 18 µm, in attaching the chip connection terminal 530 to the chip bonding pad 130, the chip connection terminal 530 may be pressed by the chip bonding pad 130, and thus, a horizontal length of the chip connection terminal 530 may be increased. Accordingly, a short-circuit fault may occur due to the contact between adjacent chip connection terminals 530.

In an example embodiment, when the chip bonding pad 130 has a circular truncated cone shape, the length 130d_B of the bottom side BS of the chip bonding pad 130 may be about 1.1 times to about 6 times the length 130d_T of the top side of the chip bonding pad 130.

In other words, when the length 130d_T of the top side of the chip bonding pad 130 is about 5 µm to about 25 µm, the length 130d_B of the bottom side BS of the chip bonding pad 130 may have a value, which is about 1.1 times to about 6 times the length 130d_T of the top side, in a range of about 20 µm to about 30 µm.

For example, when the length 130d_T of the top side of the chip bonding pad 130 is about 5 µm, the length 130d_B of the bottom side BS of the chip bonding pad 130 may range from about 20 µm to about 30 µm.

In addition, when the length 130d_T of the top side of the chip bonding pad 130 is about 25 µm, the length 130d_B of the bottom side BS of the chip bonding pad 130 may range from about 27.5 µm to about 30 µm.

Further, for example, when the length 130d_T of the top side of the chip bonding pad 130 is about 10 µm, the length 130d_B of the bottom side BS of the chip bonding pad 130 may range from about 11 µm to about 30 µm.

When the length 130d_B of the bottom side BS of the chip bonding pad 130 is less than 1.1 times the length 130d_T of the top side TS of the chip bonding pad 130, the bonding reliability between the chip connection terminal 530 (see FIG. 6) and the chip bonding pad 130 may be poor. In addition, when the length 130d_B of the bottom side BS of the chip bonding pad 130 is greater than 6 times the length 130d_T of the top side TS of the chip bonding pad 130, the alignment between the chip connection terminal 530 (see FIG. 6) and the chip bonding pad 130 may be difficult.

The chip bonding pad 130 may have a circular truncated cone shape, and the length 130d_B of the bottom side BS of the chip bonding pad 130 may be about 1.1 times to about 6 times the length 130d_T of the top side TS of the chip bonding pad 130. Accordingly, the contact area between the chip bonding pad 130 and the chip connection terminal 530 (see FIG. 6) may be increased, and the bonding reliability between the chip bonding pad 130 and the chip connection terminal 530 may be improved. In addition, the alignment between the chip connection terminal 530 and the chip bonding pad 130 may be facilitated.

In an example embodiment, the lateral sides SS of the chip bonding pad 130 may be surrounded by the second upper insulating layer 117. In other words, the second upper insulating layer 117 may have a hole 117H that exposes the chip bonding pad 130.

In an example embodiment, a level of a top surface 117a of the second upper insulating layer 117 may be higher than a level of a top surface of the chip bonding pad 130. In other words, a length formed by the second upper insulating layer 117 in the vertical direction from the mounting surface 110a of the insulating layer 110 may be greater than a length formed by the chip bonding pad 130 in the vertical direction from the mounting surface 110a of the insulating layer 110.

The pad seed layer 140 of the package substrate 10 may be arranged between the insulating layer 110 and the chip bonding pad 130 and may electrically connect the upper pad via pattern 127 to the chip bonding pad 130. The pad seed layer 140 may be formed on a surface of the first upper insulating layer 113 by a physical vapor deposition process. In addition, the chip bonding pad 130 may be formed by a plating process using the pad seed layer 140.

In an example embodiment, the pad seed layer 140 may include copper (Cu), titanium (Ti), titanium tungsten (TiW), titanium nitride (TiN), tantalum (Ta), tantalum nitride (TaN), chromium (Cr), aluminum (Al), or a combination thereof. For example, the pad seed layer 140 and the chip bonding pad 130 may include Cu/Ti in which copper is stacked on titanium, or Cu/TiW in which copper is stacked on titanium tungsten.

For example, when copper (Cu) is used as the material of the chip bonding pad 130, at least a portion of the pad seed layer 140 may function as a diffusion barrier layer.

The external connection pad 150 of the package substrate 10 may be a pad arranged on one surface (e.g., a lower surface) of the first lower insulating layer 114 and connected to the lower pad via pattern 129. In addition, the external connection pad 150 may be a pad for electrically connecting the wiring pattern 120 of the package substrate 10 to an external device.

In an example embodiment, the second lower insulating layer 118 may be arranged on the first lower insulating layer 114 and may cover a portion of the external connection pad 150. In addition, the second lower insulating layer 118 may expose the other portion of the external connection pad 150 to the outside.

Because the package substrate 10 according to an example embodiment may include the chip bonding pad 130 having a tapered shape in which a horizontal cross-sectional area thereof gradually decreases away from the mounting surface 110a of the insulating layer 110 in the vertical direction, in attaching the chip connection terminal 530 (see FIG. 6) of the semiconductor chip 50 (see FIG. 6) to the surface of the chip bonding pad 130, the area of the chip bonding pad 130, which contacts the chip connection terminal 530, may be increased.

Accordingly, the bonding reliability between the semiconductor chip 50 and the package substrate 10 may be improved, and the structural reliability of a semiconductor package 1 (see FIG. 6) including the semiconductor chip 50 and the package substrate 10 may be improved.

Figure 3A:
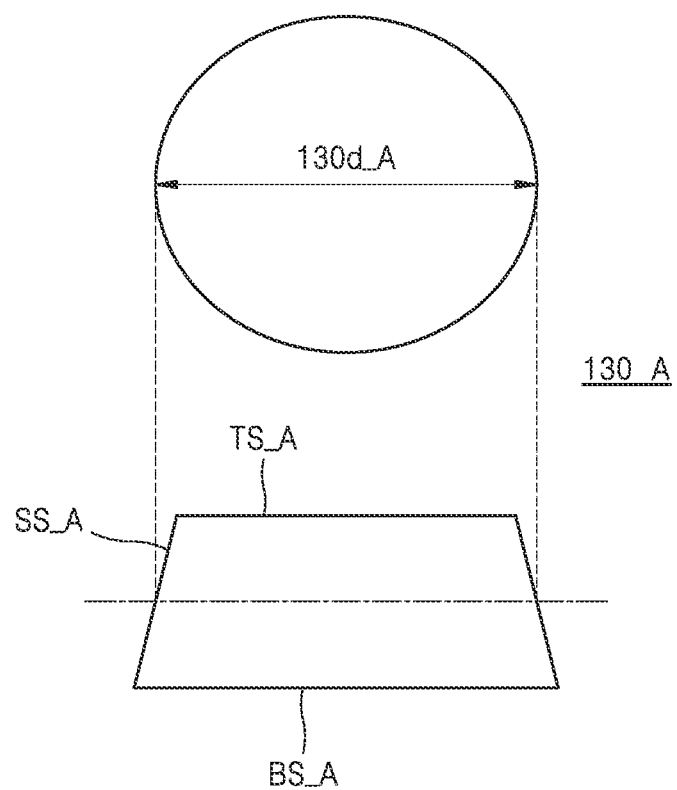
FIGS. 3A, 3B, and 3C are cross-sectional views of chip bonding pads according to an example embodiment.
Figure 3B:
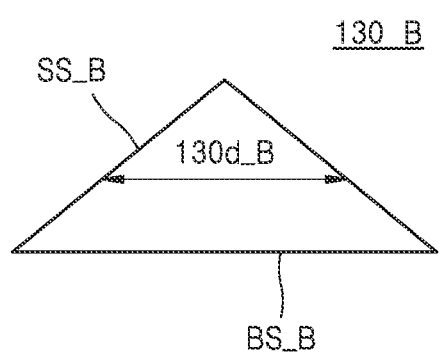
Figure 3C:
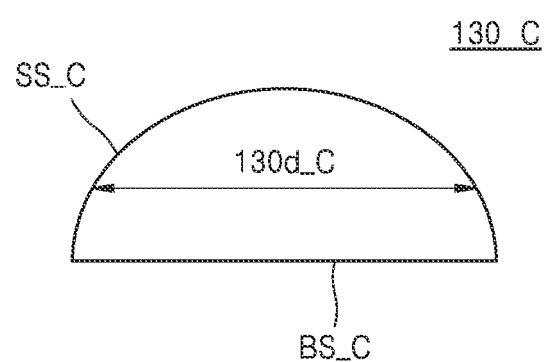

FIGS. 3A, 3B, and 3C are cross-sectional views of chip bonding pads 130_A, 130_B, and 130_C according to an example embodiment.

Each of the chip bonding pads 130_A, 130_B, and 130_C according to an example embodiment of the disclosure may be a pad arranged on the mounting surface 110a of the insulating layer 110 and configured to connect the semiconductor chip 50 (see FIG. 6) to the wiring pattern 120.

Each of the chip bonding pads 130_A, 130_B, and 130_C according to an example embodiment may have a tapered shape in which a horizontal cross-sectional area thereof gradually decreases away from the mounting surface 110a of the insulating layer 110 in the vertical direction.

In an example embodiment, when a vertical cross-section of each of the chip bonding pads 130_A, 130_B, and 130_C is considered, respective horizontal lengths 130d_A, 130d_B, and 130d_C of the chip bonding pads 130_A, 130_B, and 130_C may gradually decrease away from the mounting surface 110a of the insulating layer 110 in the vertical direction.

In an example embodiment, a material of each of the chip bonding pads 130_A, 130_B, and 130_C may include, but is not limited to, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

Referring to FIG. 3A, a first chip bonding pad 130_A may have a circular truncated cone shape. For example, the shape of the first chip bonding pad 130_A may be a shape of a three-dimensional figure not including the vertex of a circular cone, out of two three-dimensional figures obtained by cutting the circular cone in a direction parallel to the base of the circular cone.

In addition, a vertical cross-section of the first chip bonding pad 130_A may have a trapezoidal shape, which has a top side TS_A, a bottom side BS_A that is greater in length than the top side TS_A, and lateral sides SS_A connecting the top side TS_A to the bottom side BS_A.

In addition, a horizontal cross-section of the first chip bonding pad 130_A may have a circular shape. Further, when the horizontal cross-section of the first chip bonding pad 130_A has a shape of a circle, a horizontal length 130d_A of the first chip bonding pad 130_A may be defined as a diameter of the circle. The horizontal length 130d_A of the first chip bonding pad 130_A may gradually decrease away from the mounting surface 110a of the insulating layer 110 in the vertical direction.

Because descriptions of the first chip bonding pad 130_A may be the same as the descriptions given with reference to FIGS. 1 and 2, repeated descriptions are omitted.

Referring to FIG. 3B, a second chip bonding pad 130_B may have a circular cone shape. For example, a vertical cross-section of the second chip bonding pad 130_B may have a triangular shape, which has a bottom side BS_B and lateral sides SS_B. For example, the vertical cross-section of the second chip bonding pad 130_B may have a shape of an acute-angled triangle.

In addition, a horizontal cross-section of the second chip bonding pad 130_B may have a circular shape. Further, when the horizontal cross-section of the second chip bonding pad 130_B has a shape of a circle, a horizontal length 130d_B of the second chip bonding pad 130_B may be defined as a diameter of the circle. The horizontal length 130d_B of the second chip bonding pad 130_B may gradually decrease away from the mounting surface 110a of the insulating layer 110 in the vertical direction.

Referring to FIG. 3C, a third chip bonding pad 130_C may have a hemispherical shape. For example, a vertical cross-section of the third chip bonding pad 130_C may have a semicircular shape, which has a bottom side BS_C and curved lateral sides SS_C.

In addition, a horizontal cross-section of the third chip bonding pad 130_C may have a circular shape. Further, when the horizontal cross-section of the third chip bonding pad 130_C has a shape of a circle, a horizontal length 130d_C of the third chip bonding pad 130_C may be defined as a diameter of the circle. The horizontal length 130d_C of the third chip bonding pad 130_C may gradually decrease away from the mounting surface 110a of the insulating layer 110 in the vertical direction.

Figure 4:
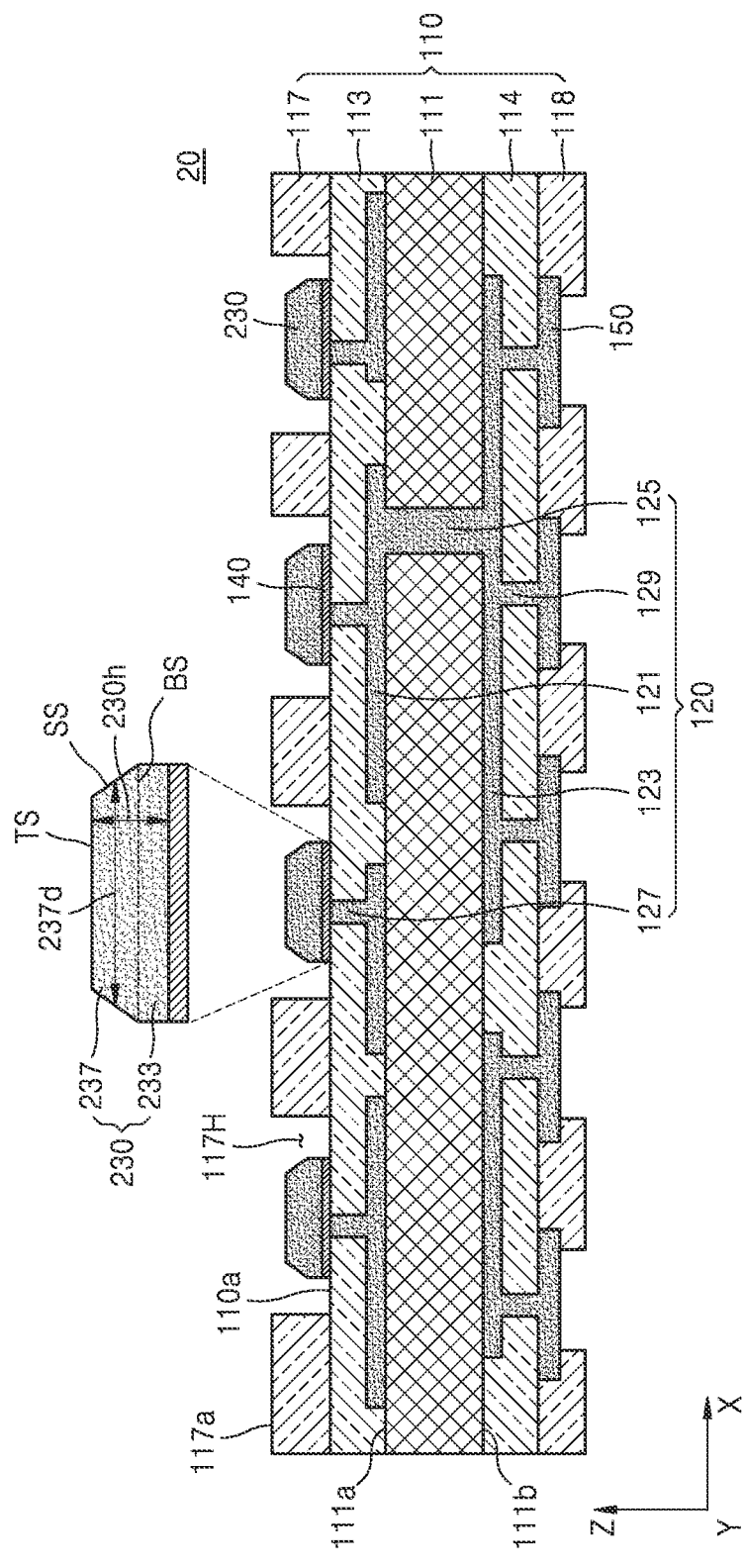
FIG. 4 is a cross-sectional view of a package substrate according to an example embodiment.

FIG. 4 is a cross-sectional view of a package substrate 20 according to an example embodiment.

Referring to FIG. 4, the package substrate 20 according to an example embodiment may include the insulating layer 110, the wiring pattern 120, a chip bonding pad 230, the pad seed layer 140, the external connection pad 150, and the like.

Hereinafter, repeated descriptions between the package substrate 10 of FIGS. 1 and 2 and the package substrate 20 of FIG. 4 are omitted, and differences therebetween will be mainly described.

As shown in FIGS. 4 and 5, chip bonding pad 230 of the package substrate 20 according to an example embodiment of the disclosure may include a connection portion 233 and a bonding portion 237 on the connection portion 233.

The connection portion 233 of the chip bonding pad 230 may be a portion of the chip bonding pad 230, in which a horizontal cross-sectional area thereof is substantially equal (i.e., uniform) in a direction perpendicular to the mounting surface 110a of the insulating layer 110. For example, the connection portion 233 of the chip bonding pad 230 may have a cylindrical shape. However, the disclosure is not limited thereto, and the connection portion 233 of the chip bonding pad 230 may have a polygonal column shape.

The bonding portion 237 of the chip bonding pad 230 may be a portion of the chip bonding pad 230, which is arranged on the connection portion 233 and has a tapered shape having a horizontal cross-sectional area that gradually decreases away from the mounting surface 110a of the insulating layer 110 in the vertical direction.

In an example embodiment, the connection portion 233 and the bonding portion 237 of the chip bonding pad 230 may be integrated. In addition, the connection portion 233 and the bonding portion 237 of the chip bonding pad 230 may include substantially the same material.

In an example embodiment, when a vertical cross-section of the bonding portion 237 of the chip bonding pad 230 is considered, a horizontal length 237d of the bonding portion 237 may gradually decrease away from the mounting surface 110a of the insulating layer 110 in the vertical direction.

In an example embodiment, the connection portion 233 of the chip bonding pad 230 may have a cylindrical shape, and the bonding portion 237 of the chip bonding pad 230 may have a circular truncated cone shape.

In an example embodiment, a vertical cross-section of the bonding portion 237 of the chip bonding pad 230 may have a trapezoidal shape, which has the top side TS, the bottom side BS that is greater in length than the top side TS, and the lateral sides SS connecting the top side TS to the bottom side BS.

In addition, a horizontal cross-section of the bonding portion 237 of the chip bonding pad 230 may have a circular shape. The horizontal length 237d of the bonding portion 237 of the chip bonding pad 230 may decrease away from the mounting surface 110a of the insulating layer 110 in the vertical direction.

In an example embodiment, when the bonding portion 237 of the chip bonding pad 230 has a circular truncated cone shape, the top side TS of the chip bonding pad 230 may have a length of about 5 μm to about 25 μm, and the bottom side BS of the chip bonding pad 230 may have a length, which is greater than the length of the top side TS, in a range of about 20 µm to about 30 µm.

In addition, a height 230h of the chip bonding pad 230 may be defined as a length formed in the vertical direction by the connection portion 233 and the bonding portion 237. In an example embodiment, the height 230h of the chip bonding pad 230 may range from about 12 µm to about 18 µm.

In an example embodiment, when the bonding portion 23 of the chip bonding pad 230 has a circular truncated cone shape, a horizontal length of the bottom side BS of the bonding portion 237 of the chip bonding pad 230 may be about 1.1 times to about 6 times a horizontal length of the top side TS of the bonding portion 237. In addition, a horizontal length of the connection portion 233 of the chip bonding pad 230 may be about 1.1 times to about 6 times the horizontal length of the top side TS of the bonding portion 237 of the chip bonding pad 230.

In an example embodiment, when the horizontal length of the top side TS of the bonding portion 237 of the chip bonding pad 230 ranges from about 5 µm to about 25 µm, the horizontal length of the bottom side BS of the bonding portion 237 of the chip bonding pad 230 may have a value, which is about 1.1 times to about 6 times the horizontal length of the top side TS of the bonding portion 237, in a range of about 20 µm to about 30 µm.

In an example embodiment, when the horizontal length of the bottom side BS of the bonding portion 237 of the chip bonding pad 230 is less than 1.1 times the horizontal length of the top side TS of the bonding portion 237, the bonding reliability between a chip connection terminal of a semiconductor chip and the chip bonding pad 230 may be poor. In addition, when the horizontal length of the bottom side BS of the bonding portion 237 of the chip bonding pad 230 is greater than 6 times the horizontal length of the top side TS of the bonding portion 237, the alignment between the chip connection terminal of the semiconductor chip and the chip bonding pad 230 may be difficult.

The chip bonding pad 230 of the package substrate 20 according to an example embodiment may have a circular truncated cone shape, the horizontal length of the bottom side BS of the bonding portion 237 of the chip bonding pad 230 may be about 1.1 times to about 6 times the horizontal length of the top side TS of the bonding portion 237.

Accordingly, the area of the chip bonding pad 230, which contacts the chip connection terminal of the semiconductor chip, may be increased, and the bonding reliability between the chip bonding pad 230 and the chip connection terminal of the semiconductor chip may be improved. In addition, the alignment between the chip bonding pad 230 and the chip connection terminal may be facilitated.

Figure 5A:
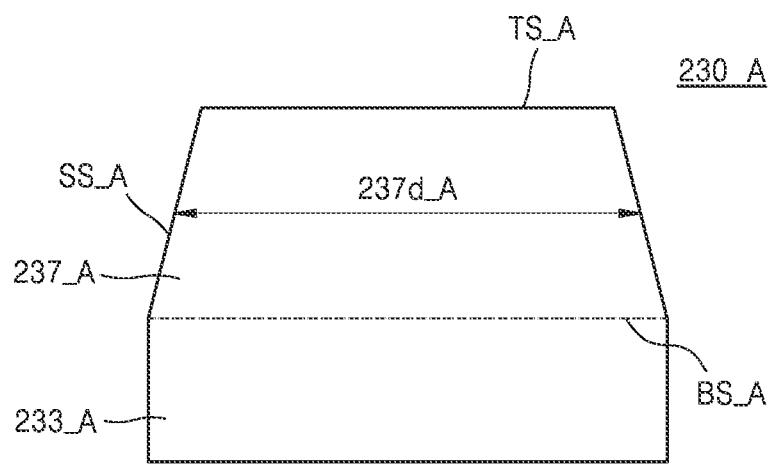
FIGS. 5A, 5B, and 5C are cross-sectional views of chip bonding pads according to an example embodiment.
Figure 5B:
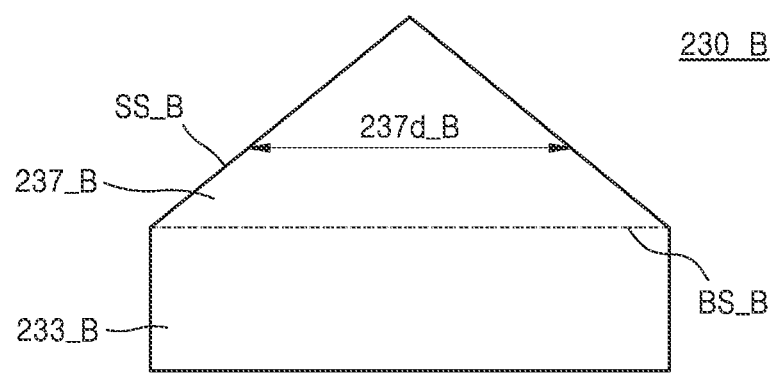
Figure 5C:
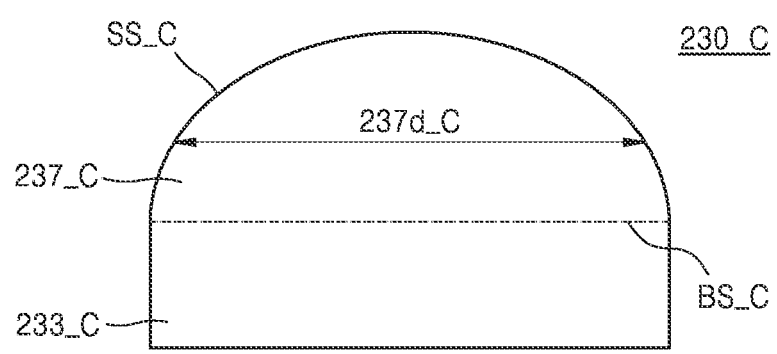

FIGS. 5A, 5B, and 5C are cross-sectional views of chip bonding pads 230_A, 230_B, and 230_C according to an example embodiment of the disclosure.

Referring to FIG. 5A, a connection portion 233_A of a first chip bonding pad 230_A may have a cylindrical shape, and a bonding portion 237_A of the first chip bonding pad 230_A may have a circular truncated cone shape. In addition, when a vertical cross-section of the first chip bonding pad 230_A is considered, a vertical cross-section of the connection portion 233_A may have a rectangular shape, and a vertical cross-section of the bonding portion 237_A may have a trapezoidal shape, which has a top side TS_A, a bottom side BS_A that is greater in length than the top side TS_A, and lateral sides SS_A connecting the top side TS_A to the bottom side BS_A.

In an example embodiment, a horizontal cross-section of the first chip bonding pad 230_A may have a circular shape. A horizontal length 237d_A of the bonding portion 237_A of the first chip bonding pad 230_A may gradually decrease away from the mounting surface 110a of the insulating layer 110 in the vertical direction.

Referring to FIG. 5B, a connection portion 233_B of a second chip bonding pad 230_B may have a cylindrical shape, and a bonding portion 237_B of the second chip bonding pad 230_B may have a circular cone shape. In addition, when a vertical cross-section of the second chip bonding pad 230_B is considered, a vertical cross-section of the connection portion 233_B may have a rectangular shape, and a vertical cross-section of the bonding portion 237_B may have a triangular shape, which has a bottom side BS_B and lateral sides SS_B.

In an example embodiment, a horizontal cross-section of the second chip bonding pad 230_B may have a circular shape. A horizontal length 237d_B of the bonding portion 237_B of the second chip bonding pad 230_B may gradually decrease away from the mounting surface 110a of the insulating layer 110 in the vertical direction.

Referring to FIG. 5C, a connection portion 233_C of a third chip bonding pad 230_C may have a cylindrical shape, and a bonding portion 237_C of the third chip bonding pad 230_C may have a hemispherical shape. In addition, when a vertical cross-section of the third chip bonding pad 230_C is considered, a vertical cross-section of the connection portion 233_C may have a rectangular shape, and a vertical cross-section of the bonding portion 237_C may have a semicircular shape, which has a bottom side BS_C and curved lateral sides SS_C.

In an example embodiment, a horizontal cross-section of the third chip bonding pad 230_C may have a circular shape. A horizontal length 237d_C of the bonding portion 237_C of the third chip bonding pad 230_C may gradually decrease away from the mounting surface 110a of the insulating layer 110 in the vertical direction.

Figure 6:
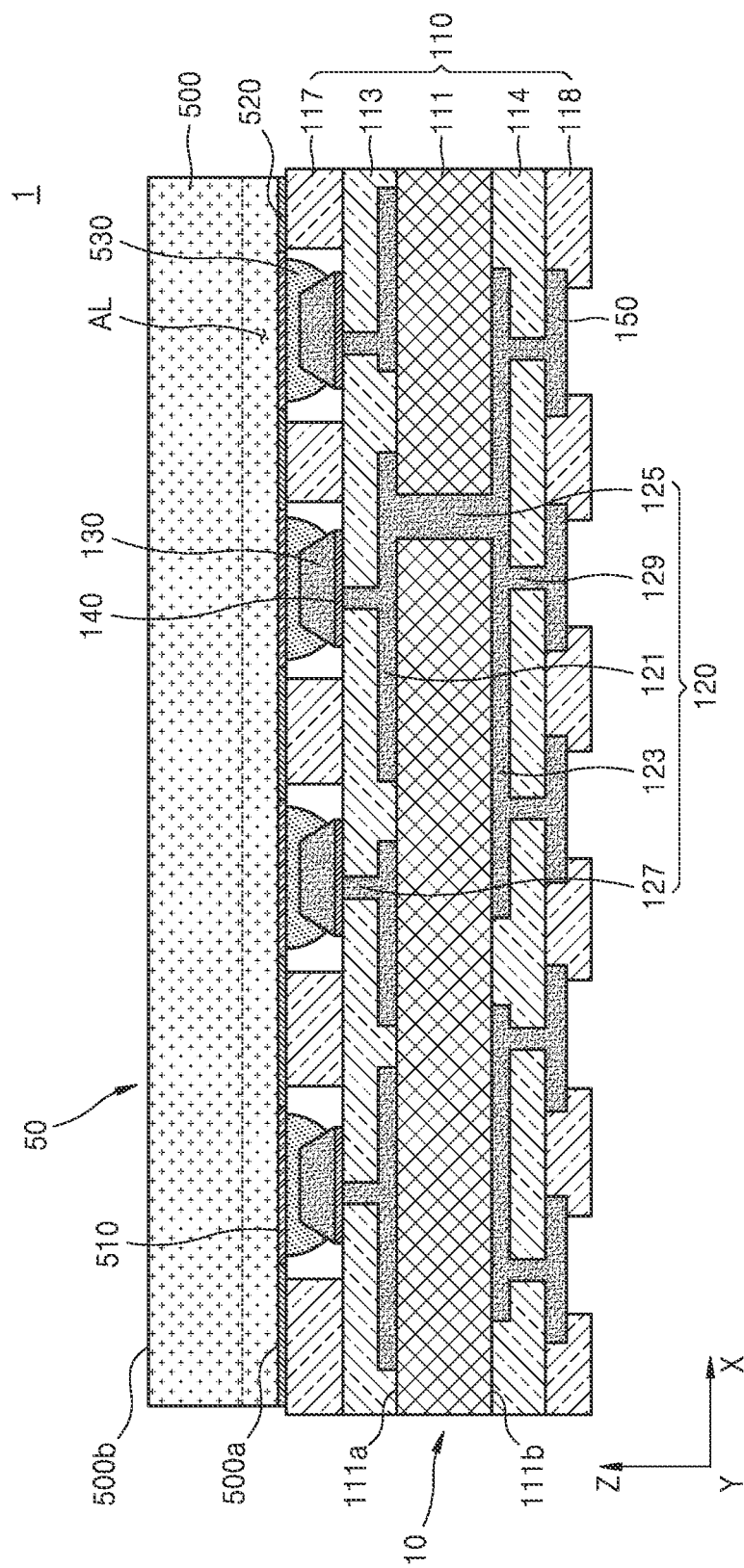
FIG. 6 is a cross-sectional view illustrating a semiconductor package according to an example embodiment.

FIG. 6 is a cross-sectional view illustrating the semiconductor package 1 according to an example embodiment.

Referring to FIG. 6, the semiconductor package 1 according to an example embodiment of the disclosure may include the package substrate 10 and the semiconductor chip 50 that is mounted on the package substrate 10. Because descriptions of the package substrate 10 are the same as the descriptions given with reference to FIGS. 1 to 5C, repeated descriptions thereof are omitted.

The semiconductor chip 50 may include a semiconductor substrate 500, a chip pad 510, a passivation layer 520, the chip connection terminal 530, and the like.

In an example embodiment, the semiconductor chip 50 may include a logic semiconductor chip. The logic semiconductor chip may include, for example, a logic semiconductor chip such as a central processing unit (CPU), a microprocessing unit (MPU), a graphics processing unit (GPU), or an application processor (AP).

In addition, the semiconductor chip 50 may include a memory semiconductor chip. The memory semiconductor chip may include, for example, a volatile memory semiconductor chip such as dynamic random access memory (DRAM) or static random access memory (SRAM), or a nonvolatile memory semiconductor chip such as phase-change random access memory (PRAM), magneto-resistive random access memory (MRAM), ferroelectric random access memory (FeRAM) or resistive random access memory (RRAM).

The semiconductor substrate 500 of the semiconductor chip 50 may have a bottom surface 500a facing the package substrate 10 and a top surface 500b that is opposite to the bottom surface 500a. The semiconductor substrate 500 may include an active layer AL in a portion thereof adjacent to the bottom surface 500a thereof.

In an example embodiment, the active layer AL may include a plurality of individual devices of various types. For example, the plurality of individual devices may include various microelectronic devices, for example, complementary metal-oxide semiconductor (CMOS) transistors, metal-oxide-semiconductor field effect transistors (MOSFETs), system large-scale integration (LSI), image sensors such as CMOS imaging sensors (CISs), micro-electro-mechanical systems (MEMSs), active elements, passive elements, and the like.

In an example embodiment, a material of the semiconductor substrate 500 may include silicon (Si). In addition, the semiconductor substrate 500 may include a semiconductor element such as germanium (Ge), or a compound such as silicon carbide (SiC), gallium arsenide (GaAs), indium arsenide (InAs), or indium phosphide (InP). However, the material of the semiconductor substrate 500 is not limited to those set forth above.

The chip pad 510 may be a pad that is arranged on the bottom surface 500a of the semiconductor substrate 500 and electrically connected to the plurality of individual devices in the active layer AL.

In an example embodiment, a material of the chip pad 510 may include a metal, such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof. However, the material of the chip pad 510 is not limited to those set forth above.

The passivation layer 520 may be arranged on the bottom surface 500a of the semiconductor substrate 500 and may surround a lateral surface of the chip pad 510. In addition, the passivation layer 520 may expose a bonding surface of the chip pad 510. In an example embodiment, the passivation layer 520 may include an insulating material such as an insulating polymer.

The chip connection terminal 530 may be a terminal electrically connecting the chip pad 510 of the semiconductor chip 50 to the chip bonding pad 130 of the package substrate 10. In an example embodiment, the chip connection terminal 530 may include a metal material including at least one of silver (Ag), copper (Cu), or aluminum (Al).

In an example embodiment, because the chip bonding pad 130 of the package substrate 10 may have a tapered shape in which a horizontal cross-sectional area thereof gradually decreases away from the mounting surface 110a of the insulating layer 110 in the vertical direction, the contact area between the chip connection terminal 530 and the chip bonding pad 130 may be increased. Accordingly, the bonding performance between the chip connection terminal 530 and the chip bonding pad 130 may be improved, and the structural reliability of the semiconductor package 1 may be improved.

In an example embodiment, when the vertical cross-section of the chip bonding pad 130 has a trapezoidal shape, the chip connection terminal 530 may surround the top side TS and the lateral sides SS of the chip bonding pad 130.

In an example embodiment, a portion of the semiconductor chip 50 may be supported by the second upper insulating layer 117. For example, a lower portion of the semiconductor chip 50 may be supported by the top surface 117a of the second upper insulating layer 117. Accordingly, the structural reliability of the semiconductor package 1 including the semiconductor chip 50 may be improved.

Figure 7:
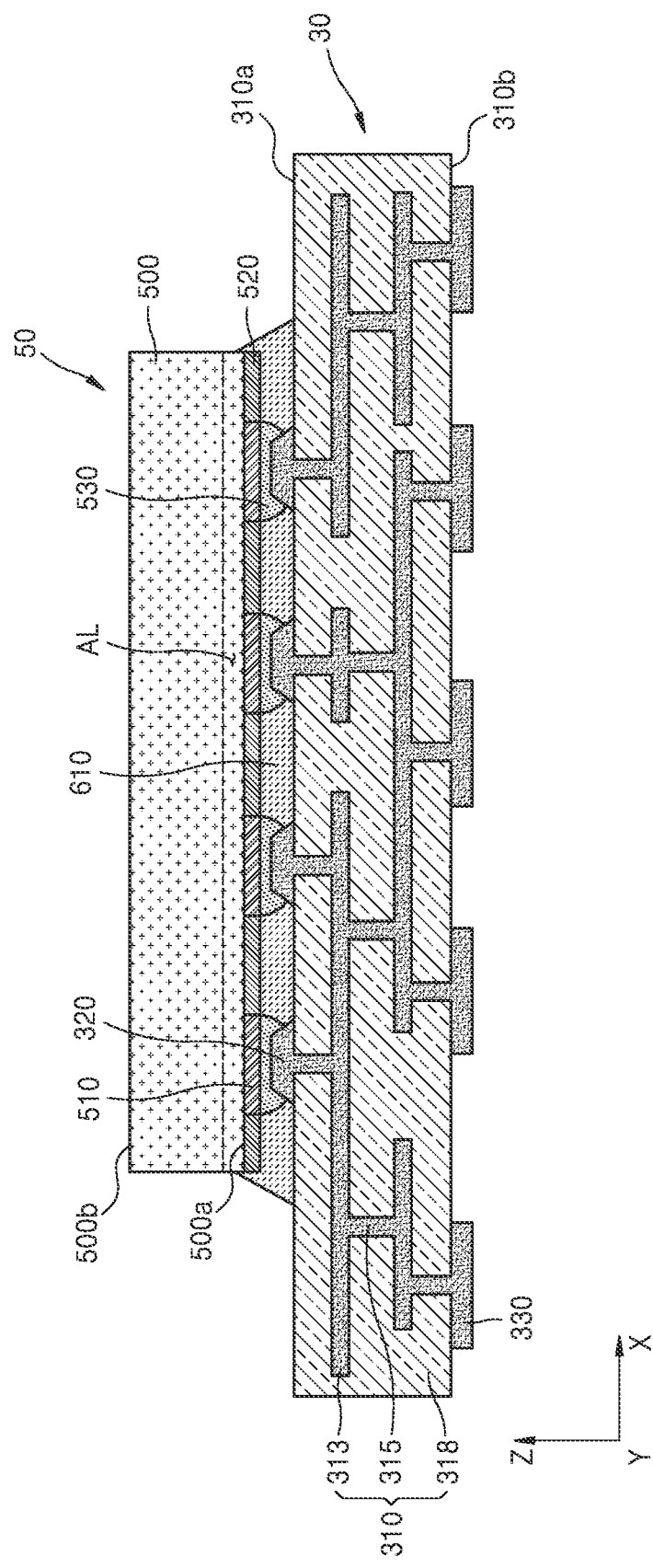
FIG. 7 is a cross-sectional view illustrating a semiconductor package according to an example embodiment.

FIG. 7 is a cross-sectional view illustrating a semiconductor package 2 according to an example embodiment. The semiconductor package 2 according to an example embodiment may include a package substrate 30 and the semiconductor chip 50 that is mounted on the package substrate 30. Because descriptions of the semiconductor chip 50 are the same as the descriptions given with reference to FIG. 6, repeated descriptions thereof are omitted.

The package substrate 30 may include a substrate fabricated at a wafer level. In an example embodiment, the package substrate 30 may include a redistribution structure 310, a chip bonding pad 320 on a top surface 310a of the redistribution structure 310, an external connection pad 330 on a bottom surface 310b of the redistribution structure 310, and the like.

In an example embodiment, the redistribution structure 310 may include a redistribution insulating layer 318, a redistribution line pattern 313 arranged in the redistribution insulating layer 318 to extend in the horizontal direction, and a redistribution via pattern 315 arranged in the redistribution insulating layer 318 to extend in the vertical direction.

In an example embodiment, a material of the redistribution insulating layer 318 may include an oxide or a nitride. For example, the redistribution insulating layer 318 may include silicon oxide or silicon nitride.

In addition, a material of each of the redistribution line pattern 313 and the redistribution via pattern 315 may include copper (Cu). However, embodiments of the disclosure are not limited thereto, and the material of each of the redistribution line pattern 313 and the redistribution via pattern 315 may include a metal, such as nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof.

In an example embodiment, the chip bonding pad 320 may be a pad for connecting the semiconductor chip 50 to the package substrate 30. For example, the chip bonding pad 320 may be a pad arranged on the top surface 310a of the redistribution structure 310 and contacting the chip connection terminal 530 of the semiconductor chip 50.

In an example embodiment, the chip bonding pad 320 may have a tapered shape in which a horizontal cross-sectional area thereof gradually decreases away from the top surface 310a of the redistribution structure 310 in the vertical direction.

In an example embodiment, the chip bonding pad 320 may have a circular truncated cone shape, a circular cone shape, or a hemispherical shape. In other words, a vertical cross-section of the chip bonding pad 320 may have a trapezoidal shape, a triangular shape, or a semicircular shape.

Because descriptions regarding specific dimensions of the shape of the chip bonding pad 320 and effects according thereto are the same as the descriptions given with reference to FIGS. 1 to 6, repeated descriptions are omitted.

In an example embodiment, an underfill layer 610 may be arranged between the semiconductor chip 50 and the redistribution structure 310. The underfill layer 610 may include an insulating material and may be configured to secure the semiconductor chip 50 onto the redistribution structure 310. The underfill layer 610 may be arranged between the semiconductor chip 50 and the redistribution structure 310 and may surround the chip bonding pad 320 and the chip connection terminal 530. However, embodiments of the disclosure are not limited to the above description, and an adhesive film such as a die attach film (DAF) may be arranged between the semiconductor chip 50 and the redistribution structure 310.

Because the chip bonding pad 320 of the package substrate 30 according to an example embodiment may have a tapered shape in which a horizontal cross-sectional area thereof gradually decreases away from the top surface 310a of the redistribution structure 310 in the vertical direction, the contact area between the chip connection terminal 530 of the semiconductor chip 50 and the chip bonding pad 320 of the package substrate 30 may be increased.

Accordingly, the bonding performance between the chip connection terminal 530 of the semiconductor chip 50 and the chip bonding pad 320 of the package substrate 30 may be improved, and the structural reliability of the semiconductor package 2 may be improved.

Figure 8:
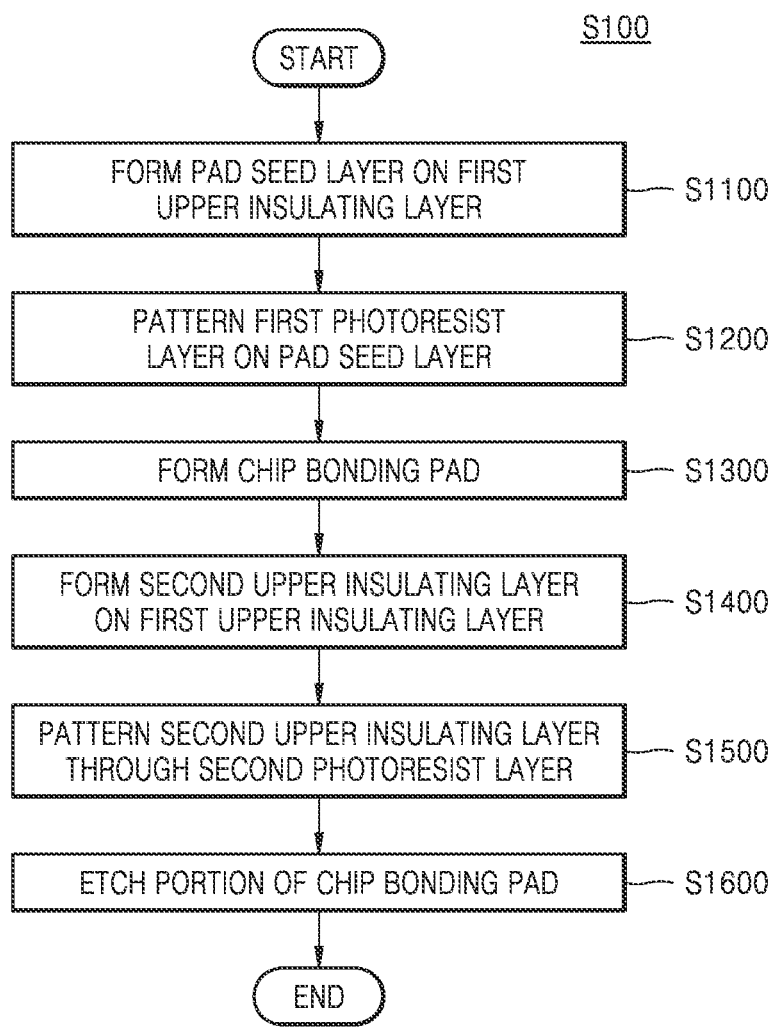
FIG. 8 is a flowchart illustrating a method of fabricating a chip bonding pad of a package substrate, according to an example embodiment.

FIG. 8 is a flowchart illustrating a method S100 of fabricating the chip bonding pad 130 of the package substrate 10, according to an example embodiment. Specifically, the method S100 of fabricating the chip bonding pad 130 of the package substrate 10, according to an example embodiment of the disclosure, may be a method of fabricating the chip bonding pad 130 of the package substrate 10 described with reference to FIGS. 1 and 2. FIGS. 9 to 17 are diagrams illustrating respective processes of the method S100 of fabricating the chip bonding pad 130 of the package substrate 10, according to an example embodiment.

Hereinafter, the method of fabricating the chip bonding pad 130 of the package substrate 10, according to an example embodiment of the disclosure, will be described in detail with reference to FIGS. 8 to 17. However, the method of fabricating the chip bonding pad 130 of the package substrate 10 is not limited to the following description.

Referring to FIG. 8, the method S100 of fabricating the chip bonding pad 130 of the package substrate 10, according to an example embodiment, may include forming the pad seed layer 140 on the first upper insulating layer 113 (S1100), patterning a first photoresist layer PR1 formed on the pad seed layer 140 (S1200), forming the chip bonding pad 130 (S1300), forming the second upper insulating layer 117 on the first upper insulating layer 113 (S1400), patterning the second upper insulating layer 117 through a second photoresist layer PR2 (S1500), and etching a portion of the chip bonding pad 130 (S1600).

Figure 9:
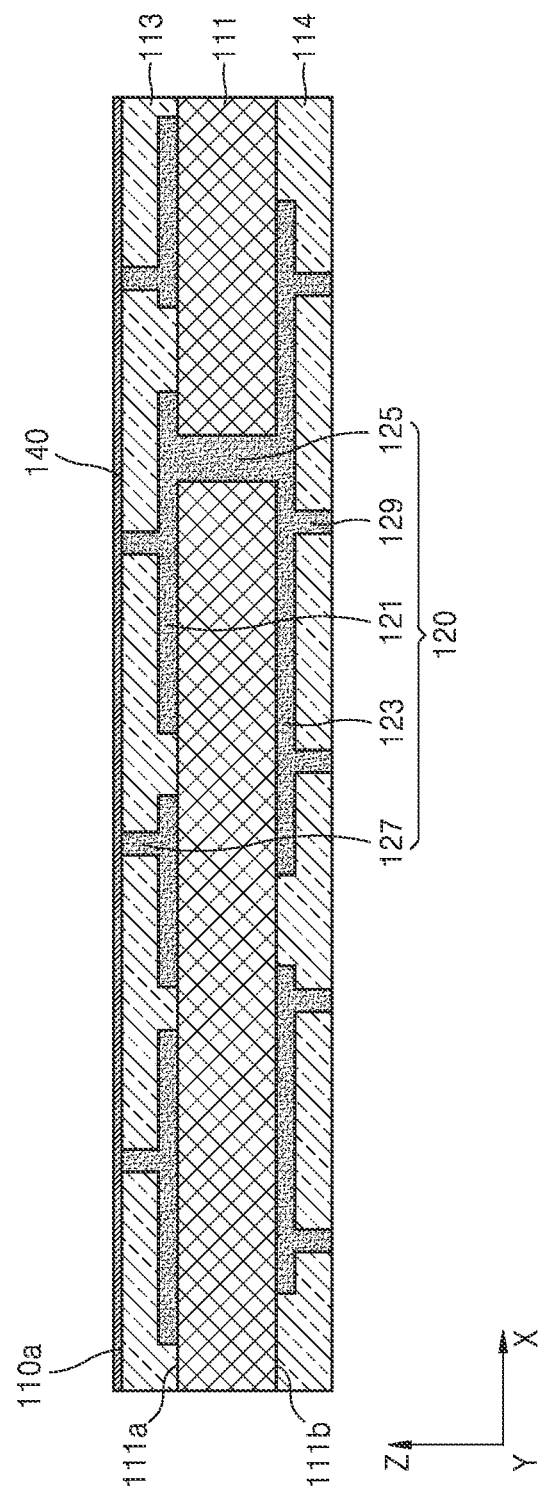
FIGS. 9 to 17 are diagrams illustrating respective processes of a method of fabricating a chip bonding pad of a package substrate, according to an example embodiment.

Referring together to FIGS. 8 and 9, operation S1100 may include forming the pad seed layer 140 on the first upper insulating layer 113.

In an example embodiment, operation S1100 may include conformally forming the pad seed layer 140 on the mounting surface 110a of the first upper insulating layer 113. For example, the pad seed layer 140 may be formed on the mounting surface 110a of the first upper insulating layer 113 by a physical vapor deposition process.

Figure 10:
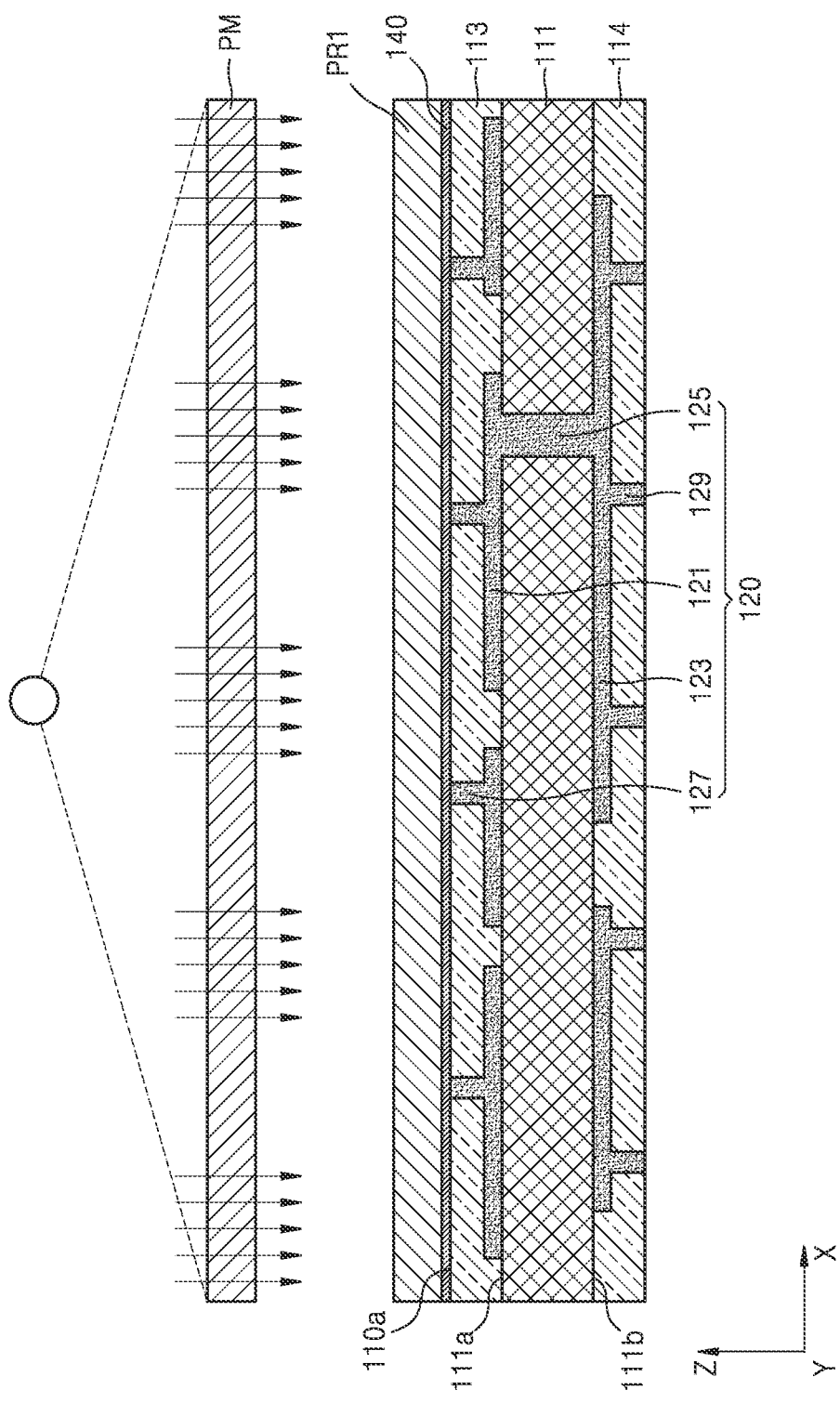
Figure 11:
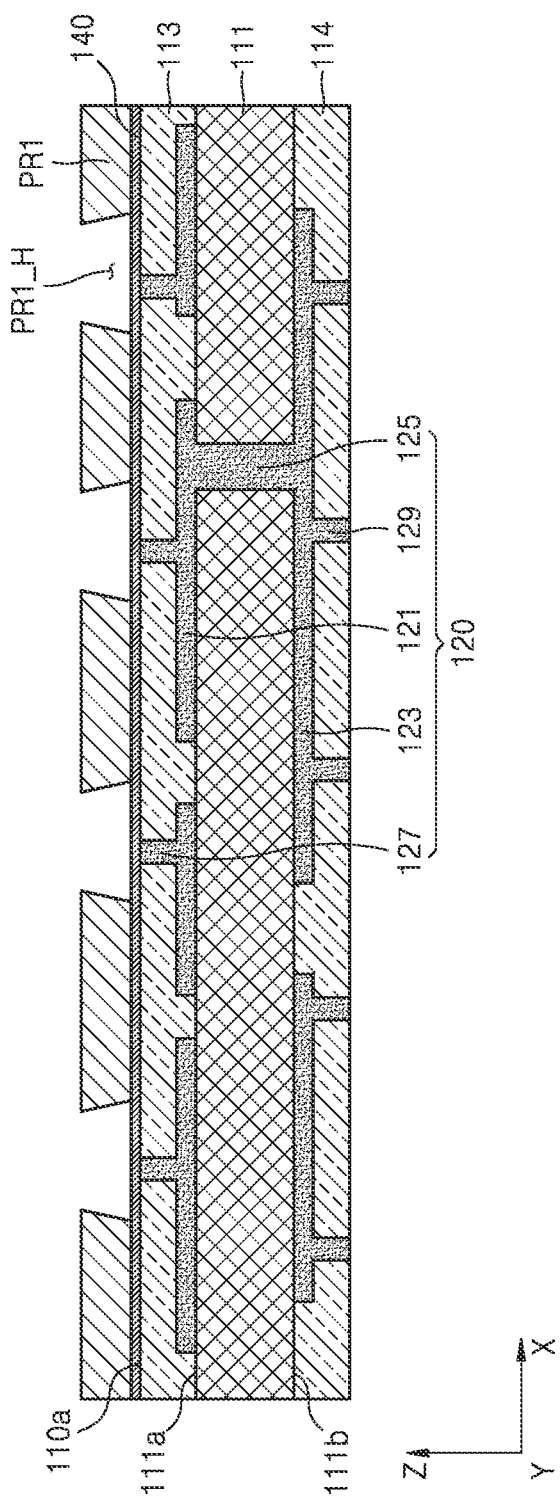

Referring together to FIGS. 8, 10, and 11, operation S1200 may include applying the first photoresist layer PR1 onto the pad seed layer 140, selectively irradiating the first photoresist layer PR1 with light, and selectively removing a portion of the first photoresist layer PR1.

In an example embodiment, the first photoresist layer PR1 applied onto the pad seed layer 140 in operation S1200 may include a negative photoresist layer. The negative photoresist layer may be a material layer in which a portion exposed by a photomask PM remains and a portion not exposed is removed.

In an example embodiment, in operation S1200, a non-exposed portion of the first photoresist layer PR1 may be removed by supplying a developer to the first photoresist layer PR1 having undergone an exposure process.

In an example embodiment, through a development process of the first photoresist layer PR1, the first photoresist layer PR1 may have a photoresist hole PR1_H vertically overlapping the upper pad via pattern 127.

In an example embodiment, because the first photoresist layer PR1 may include a negative photoresist layer, the photoresist hole PR1_H may have a tapered shape in which a horizontal cross-sectional area thereof gradually decreases away from the mounting surface 110a of the first upper insulating layer 113 in the vertical direction.

Figure 12:
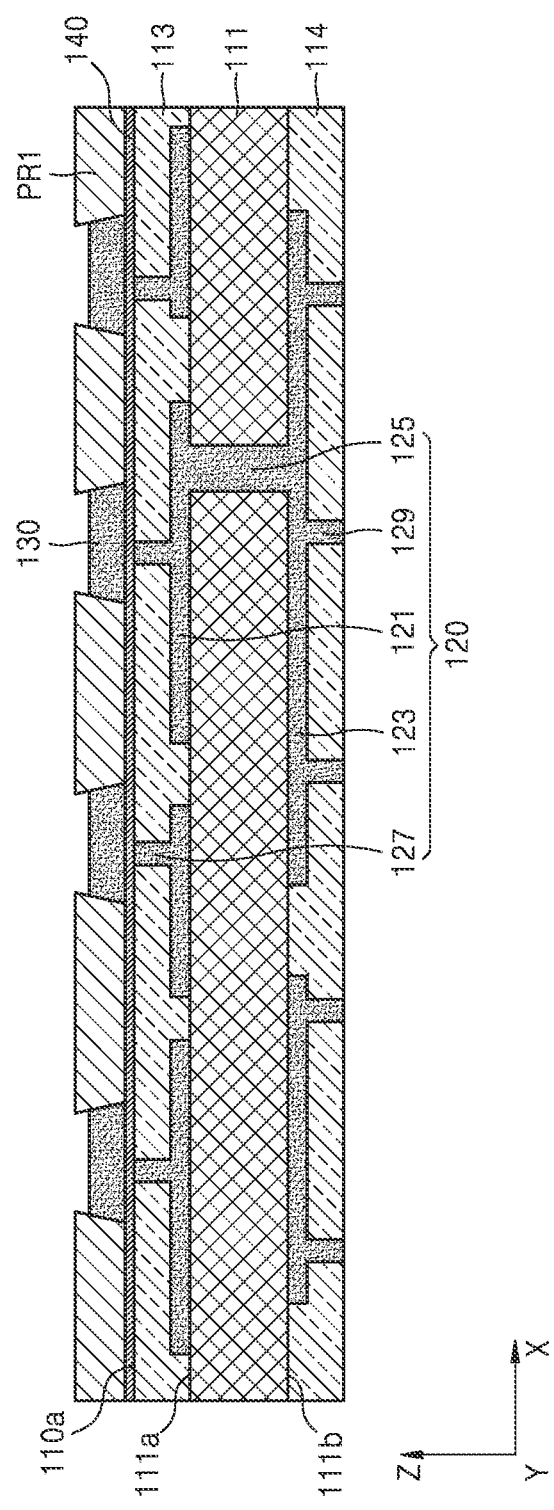
Figure 13:
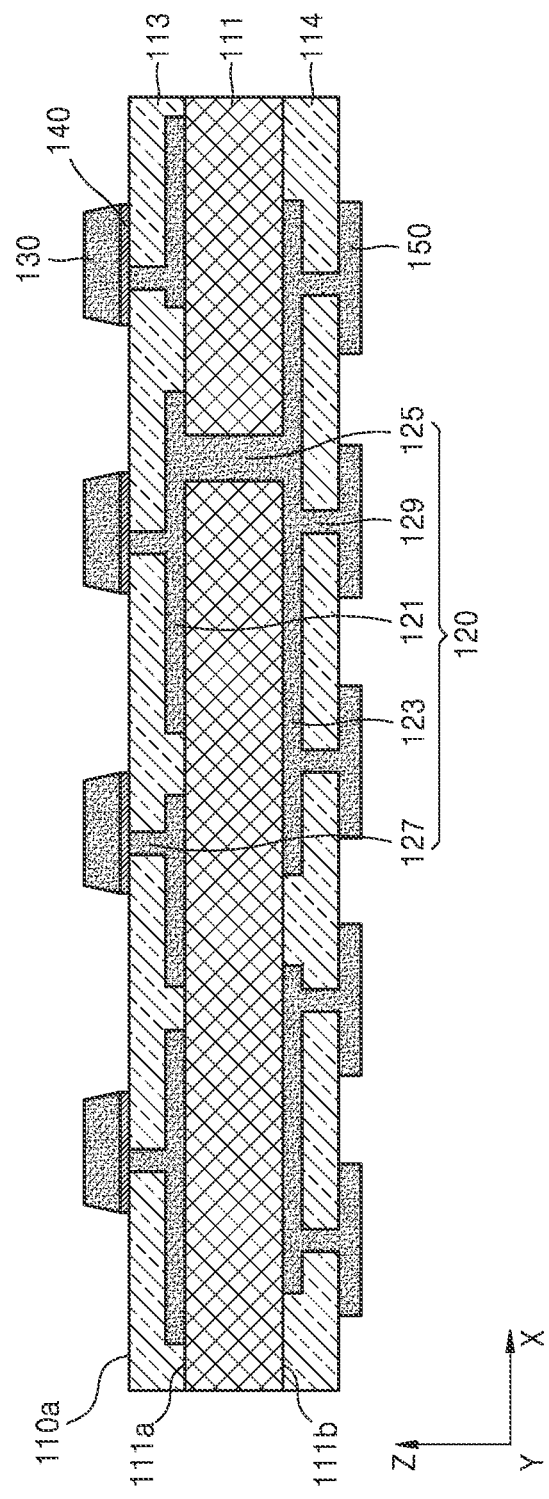

Referring together to FIGS. 8, 12, and 13, operation S1300 may include forming the chip bonding pad 130 by a plating process using the pad seed layer 140, and removing the first photoresist layer PR1 and a portion of the pad seed layer 140.

In an example embodiment, the forming of the chip bonding pad 130 may include filling a first photoresist hole PR1_H of the first photoresist layer PR1 with a metal material. For example, a portion of the pad seed layer 140, which is exposed by the first photoresist hole PR1_H, may function as a diffusion barrier layer, and the chip bonding pad 130 may be formed by an electroless plating process using the pad seed layer 140.

In an example embodiment, after the chip bonding pad 130 is formed, the first photoresist layer PR1 and a portion of the pad seed layer 140, which does not vertically overlap the chip bonding pad 130, may be removed.

In an example embodiment, the external connection pad 150 may be fabricated by substantially the same method as the fabrication process of the chip bonding pad 130.

Figure 14:
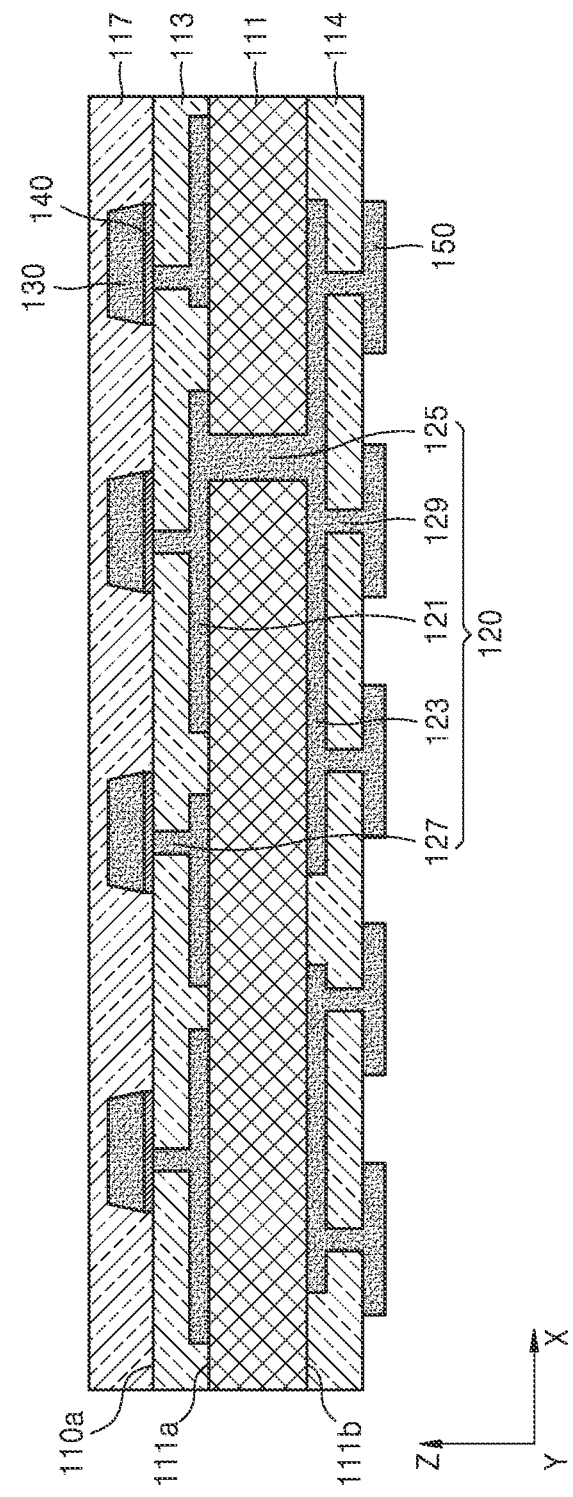

Referring together to FIGS. 8 and 14, operation S1400 may include forming the second upper insulating layer 117 on the first upper insulating layer 113.

In operation S1400, the second upper insulating layer 117 may be formed on the first upper insulating layer 113 to cover an outer surface including an upper surface of the chip bonding pad 130. For example, a vertical length of the second upper insulating layer 117 may be greater than a vertical length of the chip bonding pad 130.

Figure 15:
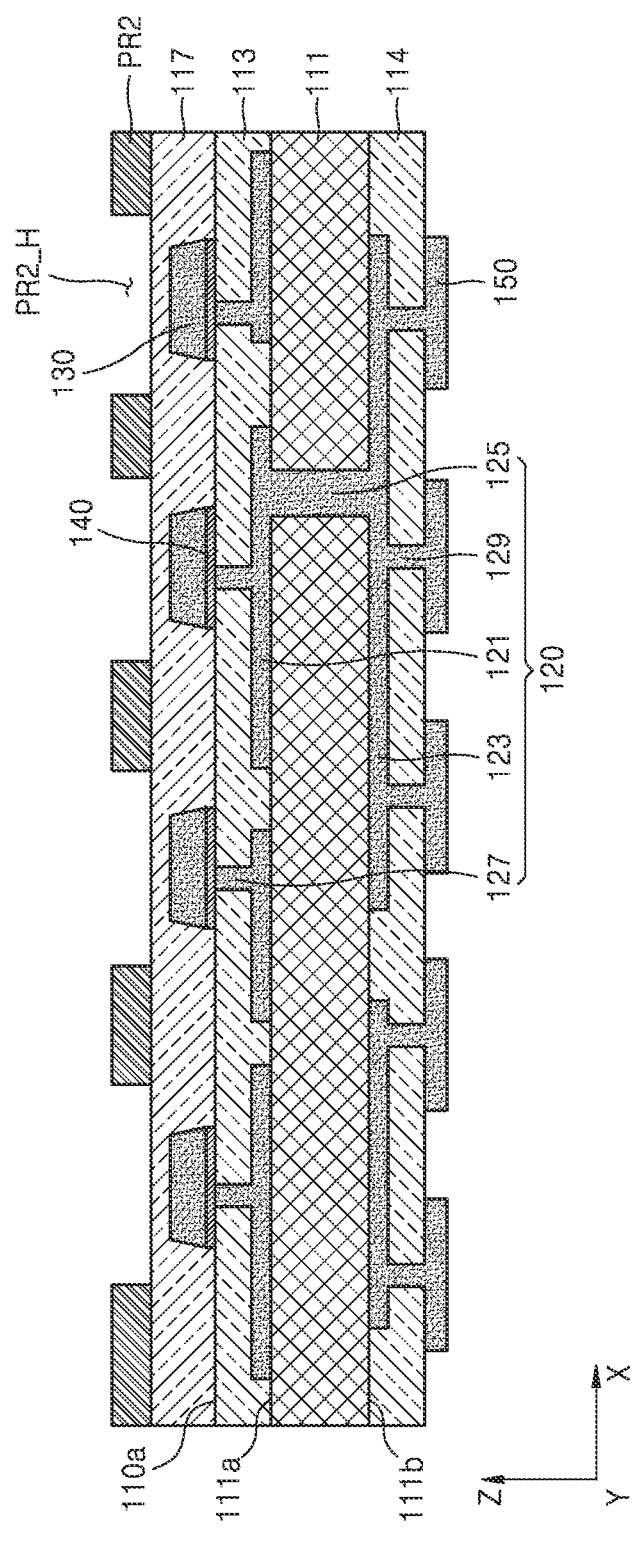
Figure 16:
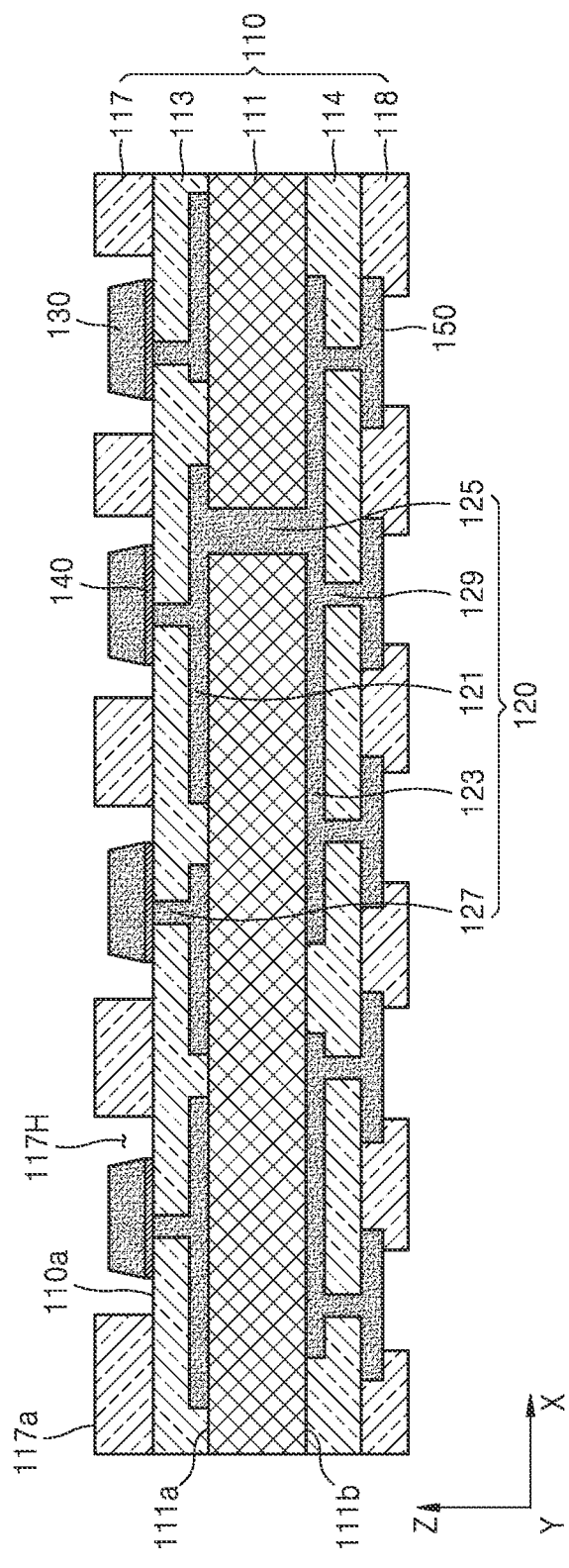

Referring together to FIGS. 8, 15, and 16, operation S1500 may include forming the second photoresist layer PR2 on the second upper insulating layer 117, selectively irradiating the second photoresist layer PR2 with light, selectively removing a portion of the second photoresist layer PR2, and removing the remaining second photoresist layer PR2 and a portion of the second upper insulating layer 117.

In an example embodiment, the second photoresist layer PR2 may have a second photoresist hole PR2_H, which vertically overlaps the chip bonding pad 130, through an exposure process and a development process.

In an example embodiment, a portion of the second upper insulating layer 117, which vertically overlaps the second photoresist hole PR2_H of the second photoresist layer PR2, may be removed. Accordingly, the remaining second upper insulating layer 117 may surround a lateral portion of the chip bonding pad 130.

In an example embodiment, the second lower insulating layer 118 may be fabricated by substantially the same method as the fabrication process of the second upper insulating layer 117.

Figure 17:
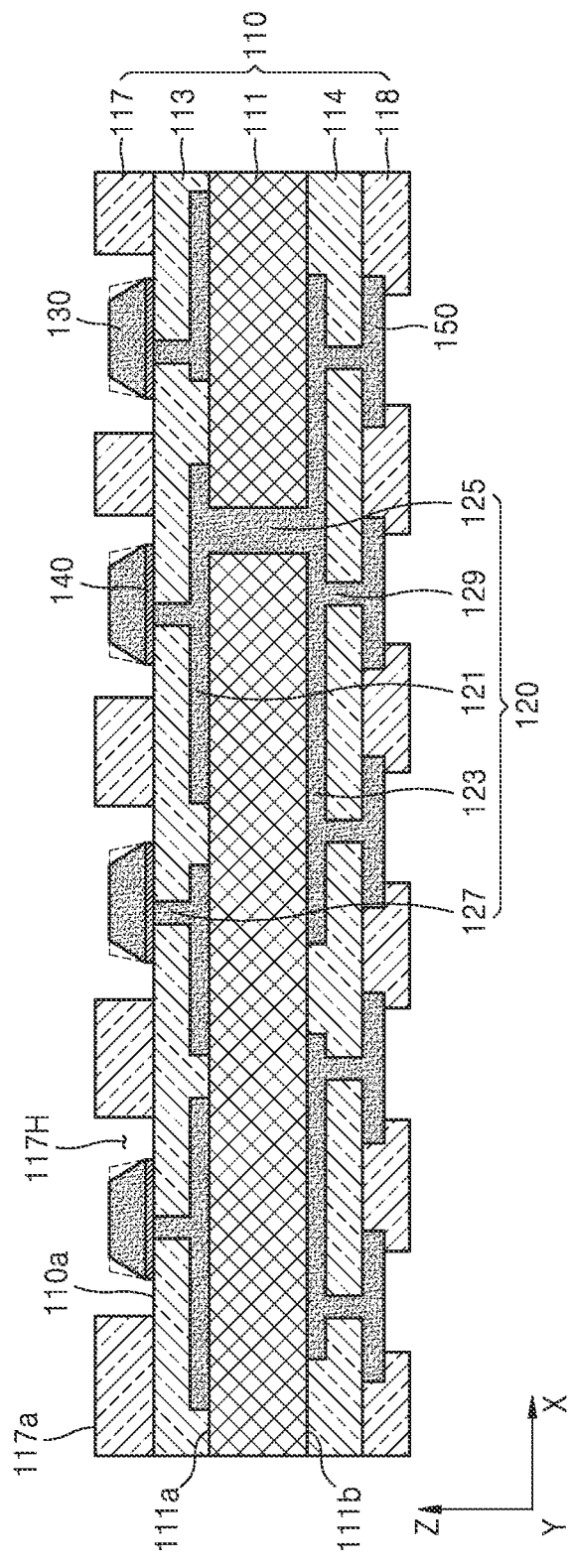

Referring together to FIGS. 8 and 17, operation S1600 may include etching a portion of the chip bonding pad 130 such that the chip bonding pad 130 has a tapered shape in which a horizontal cross-sectional area thereof gradually decreases away from the mounting surface 110a of the first upper insulating layer 113 in the vertical direction.

In an example embodiment, operation S1600 may include providing an etchant to a structure of FIG. 16, and etching the surface of the chip bonding pad 130 by adjusting a flow of the etchant.

However, embodiments of the disclosure are not limited to the above description, and operation S1600 may include etching the surface of the chip bonding pad 130 by laser light.

In an example embodiment, when the chip bonding pad 130 has a circular truncated cone shape in which a vertical cross-section thereof has a trapezoidal shape, a tilt angle formed by the bottom side BS (see FIG. 2) and the lateral side SS (see FIG. 2) of the chip bonding pad 130 may be reduced by the etching process, in operation S1600.

The chip bonding pad 130, which is fabricated by the method S100 of fabricating the chip bonding pad 130 of the package substrate 10, according to an example embodiment of the disclosure, may have a tapered shape in which a horizontal cross-sectional area thereof gradually decreases away from the mounting surface 110a of the first upper insulating layer 113 in the vertical direction.

In mounting the semiconductor chip 50 on the package substrate 10, the contact area between the chip connection terminal 530 (see FIG. 6) of the semiconductor chip 50 (see FIG. 6) and the chip bonding pad 130 of the package substrate 10 may be increased. Accordingly, the bonding performance between the chip connection terminal 530 (see FIG. 6) of the semiconductor chip 50 (see FIG. 6) and the chip bonding pad 130 of the package substrate 10 may be improved.

As described above, according to one or more example embodiments of the disclosure, the package substrate may include the chip bonding pad having a tapered shape in which a horizontal cross-sectional area thereof gradually decreases away from one surface of the insulating layer. In mounting the semiconductor chip onto the package substrate, the area of the chip bonding pad of the package substrate, which contacts the chip connection terminal of the semiconductor chip, may be increased. Accordingly, the bonding reliability between the semiconductor chip and the package substrate may be improved, and the structural reliability of the semiconductor package including the semiconductor chip and the package substrate may be improved.

While example embodiments has been particularly shown and described, it will be understood that various changes in form and details may be made therein without departing from the spirit and scope of the following claims.

What is claimed is:

1. A package substrate comprising:
   an insulating layer comprising a first upper insulating layer having a mounting surface and a second upper insulating layer provided on the first upper insulating layer;
   a wiring pattern extending in the insulating layer; and
   a chip bonding pad provided on the mounting surface of the first upper insulating layer and connected to the wiring pattern, the chip bonding pad having a tapered shape in which a horizontal cross-sectional area of the chip bonding pad gradually decreases away from the mounting surface of the first upper insulating layer in a vertical direction,
   wherein a portion of the chip bonding pad closest to the mounting surface of the first upper insulating layer has a horizontal length of about 20 μm to about 30 μm, and
   wherein the second upper insulating layer comprises a hole in which the chip bonding pad is provided and through which the chip bonding pad and a portion of the mounting surface of the first upper insulating layer are exposed.

2. The package substrate of claim 1, wherein the chip bonding pad has at least one of a circular truncated cone shape that has a vertical cross-section having a trapezoidal shape, a circular cone shape that has a vertical cross-section having a triangular shape, or a hemispherical shape that has a vertical cross-section having a semicircular shape.

3. The package substrate of claim 1, wherein the chip bonding pad has a circular truncated cone shape that has a vertical cross-section having a trapezoidal shape,
   wherein a top side of the chip bonding pad has a length of about 5 μm to about 25 μm, and
   wherein a bottom side of the chip bonding pad has a length which is greater than the length of the top side of the chip bonding pad and is in a range of about 20 μm to about 30 μm.

4. The package substrate of claim 3, wherein the length of the bottom side of the chip bonding pad is about 1.1 times to about 6 times the length of the top side of the chip bonding pad.

5. The package substrate of claim 3, wherein a height of the chip bonding pad, which is a vertical length between the top side and the bottom side of the chip bonding pad, is in a range of about 12 μm to about 18 μm.

6. The package substrate of claim 1, further comprising a pad seed layer provided between the mounting surface of the first upper insulating layer and the chip bonding pad.

7. The package substrate of claim 1, wherein a material of the chip bonding pad comprises at least one of copper, aluminum, tungsten, titanium, tantalum, indium, molybdenum, manganese, cobalt, tin, nickel, magnesium, rhenium, beryllium, gallium, or ruthenium.

8. The package substrate of claim 1, wherein the insulating layer further comprises:
   a base insulating layer having a top surface and a bottom surface, the first upper insulating layer being provided on the top surface of the base insulating layer; and
   a first lower insulating layer on the bottom surface of the base insulating layer, and
   wherein the wiring pattern comprises:
   an upper wiring line pattern provided on the top surface of the base insulating layer, the upper wiring line pattern and extending in a horizontal direction and being surrounded by the first upper insulating layer;
   a lower wiring line pattern provided on the bottom surface of the base insulating layer in the horizontal direction and surrounded by the first lower insulating layer;
   a wiring via pattern passing through the base insulating layer in the vertical direction to connect the upper wiring line pattern to the lower wiring line pattern; and
   an upper pad via pattern passing through the first upper insulating layer in the vertical direction and connecting the chip bonding pad to the upper wiring line pattern.

9. The package substrate of claim 8,
wherein a level of a top surface of the second upper insulating layer is higher than a level of a top surface of the chip bonding pad.

10. A package substrate comprising:
an insulating layer having a mounting surface;
a wiring pattern extending in the insulating layer; and
a chip bonding pad provided on the mounting surface of the insulating layer and connected to the wiring pattern,
wherein the chip bonding pad comprises:
a connection portion having a uniform horizontal cross-sectional area in a vertical direction with respect to the mounting surface of the insulating layer; and
a bonding portion having a tapered shape in which a horizontal cross-sectional area of the bonding portion decreases away from the mounting surface of the insulating layer in the vertical direction,
wherein a vertical cross-section of the bonding portion of the chip bonding pad has a trapezoidal shape in which a length of a top side of the bonding portion is less than a length of a bottom side of the bonding portion,
wherein the top side of the bonding portion has a length of about 5 μm to about 25 μm, and
wherein the bottom side of the bonding portion has a length which is greater than the length of the top side of the bonding portion and is in a range of about 20 μm to about 30 μm.

11. The package substrate of claim 10, wherein a length formed in the vertical direction by the connection portion together with the bonding portion of the chip bonding pad is in a range of about 12 μm to about 18 μm.

12. The package substrate of claim 10, wherein the wiring pattern comprises:
a first wiring line pattern and a second wiring line pattern each extending in a horizontal direction in the insulating layer;
a wiring via pattern extending in the vertical direction in the insulating layer and connecting the first wiring line pattern to the second wiring line pattern; and
a pad via pattern extending in the vertical direction in the insulating layer and connecting the first wiring line pattern to the chip bonding pad.

13. The package substrate of claim 10, wherein the length of the bottom side of the bonding portion is about 1.1 times to about 6 times the length of the top side of the bonding portion.

14. The package substrate of claim 10, further comprising a pad seed layer provided between the insulating layer and the connection portion of the chip bonding pad,
wherein a material of the pad seed layer comprises at least one of copper, titanium, titanium tungsten, titanium nitride, tantalum, tantalum nitride, chromium, or aluminum.

15. A semiconductor package comprising:
a package substrate comprising:
an insulating layer comprising a first upper insulating layer having a mounting surface, and a second upper insulating layer provided on the first upper insulating layer;
a wiring pattern extending in the insulating layer; and
a chip bonding pad provided on the mounting surface of the first upper insulating layer and connected to the wiring pattern, the chip bonding pad having a tapered shape in which a horizontal cross-sectional area of the chip bonding pad decreases away from the mounting surface of the first upper insulating layer in a vertical direction; and a semiconductor chip mounted on the package substrate, the semiconductor chip comprising:
a semiconductor substrate having a top surface and a bottom surface, and comprising an active layer adjacent to the bottom surface;
a chip pad provided on the bottom surface of the semiconductor substrate and connected to the active layer; and
a chip connection terminal connecting the chip pad to the chip bonding pad of the package substrate,
wherein a vertical cross-section of the chip bonding pad has a trapezoidal shape,
wherein a top side of the vertical cross-section of the chip bonding pad has a horizontal length of about 5 μm to about 25 μm,
wherein a bottom side of the vertical cross-section of the chip bonding pad has a horizontal length that is about 1.1 times to about 6 times the horizontal length of the top side,
wherein lateral sides of the vertical cross-section of the chip bonding pad connect the top side to the bottom side,
wherein the chip connection terminal surrounds the top side and the lateral sides of the chip bonding pad, and
wherein the second upper insulating layer comprises a hole in which the chip bonding pad is provided and through which the chip bonding pad and a portion of the mounting surface of the first upper insulating layer are exposed.

16. The semiconductor package of claim 15, wherein a vertical length of the chip bonding pad is in a range of about 12 μm to about 18 μm.

17. The semiconductor package of claim 15, wherein the insulating layer further comprises:
a base insulating layer having a top surface and a bottom surface,
the first upper insulating layer being provided on the top surface of the base insulating layer; and
a first lower insulating layer on the bottom surface of the base insulating layer, and
wherein the wiring pattern comprises:
an upper wiring line pattern provided on the top surface of the base insulating layer and extending in a horizontal direction and surrounded by the first upper insulating layer;
a lower wiring line pattern provided on the bottom surface of the base insulating layer in the horizontal direction and surrounded by the first lower insulating layer;
a wiring via pattern passing through the base insulating layer in the vertical direction and connecting the upper wiring line pattern to the lower wiring line pattern; and
an upper pad via pattern passing through the first upper insulating layer in the vertical direction and connecting the chip bonding pad to the upper wiring line pattern.

18. The semiconductor package of claim 17,
wherein a top surface of the second upper insulating layer supports a lower portion of the semiconductor chip.

19. The semiconductor package of claim 15, wherein the package substrate further comprises a pad seed layer provided between the insulating layer and the chip bonding pad.

20. The semiconductor package of claim 19, wherein a material of the chip bonding pad comprises at least one of copper, aluminum, tungsten, titanium, tantalum, indium, molybdenum, manganese, cobalt, tin, nickel, magnesium, rhenium, beryllium, gallium, or ruthenium, and
   wherein a material of the pad seed layer comprises at least one of copper, titanium, titanium tungsten, titanium nitride, tantalum, tantalum nitride, chromium, or aluminum.

\* \* \* \* \*